US012575442B2

(12) United States Patent
Kim et al.

(10) Patent No.: US 12,575,442 B2
(45) Date of Patent: *Mar. 10, 2026

(54) SEMICONDUCTOR DEVICES AND METHODS OF MANUFACTURING SEMICONDUCTOR DEVICES

(71) Applicant: Amkor Technology Singapore Holding Pte. Ltd., Singapore (SG)

(72) Inventors: Jae Yoon Kim, Gyeonggi-do (KR); Ji Hun Lee, Gyeonggi-do (KR); Suresh Jayaraman, Gilbert, AZ (US); David Hiner, Chandler, AZ (US); Won Chul Do, Seoul (KR); Jin Young Khim, Seoul (KR); Ju Hong Shin, Seoul (KR); Kye Ryung Kim, Incheon (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 18/215,100

(22) Filed: Jun. 27, 2023

(65) Prior Publication Data

US 2023/0343607 A1    Oct. 26, 2023

Related U.S. Application Data

(63) Continuation of application No. 16/748,956, filed on Jan. 22, 2020, now Pat. No. 11,694,906.

(Continued)

(51) Int. Cl.
| | |
|---|---|
| *H01L 21/56* | (2006.01) |
| *H01L 21/311* | (2006.01) |

(Continued)

(52) U.S. Cl.
CPC .......... *H01L 21/568* (2013.01); *H01L 21/311* (2013.01); *H01L 23/3107* (2013.01);
(Continued)

(58) Field of Classification Search
CPC . H01L 21/568; H01L 21/311; H01L 23/3107; H01L 23/5389; H01L 24/05;
(Continued)

(56) References Cited

U.S. PATENT DOCUMENTS

| | | |
|---|---|---|
| 6,130,473 A | 10/2000 | Mostafazadeh et al. |
| 8,362,612 B1 | 1/2013 | Paek et al. |

(Continued)

FOREIGN PATENT DOCUMENTS

| | | |
|---|---|---|
| CN | 102668068 A | 9/2012 |
| TW | 201532213 A | 8/2015 |

OTHER PUBLICATIONS

Office Action for Taiwan Application No. 109141078 mailed May 9, 2024.

(Continued)

*Primary Examiner* — Timor Karimy
(74) *Attorney, Agent, or Firm* — Spectrum IP Law Group LLC

(57) ABSTRACT

In one example, a semiconductor device can comprise a unit substrate comprising a unit conductive structure and a unit dielectric structure, and an electronic component coupled to the unit conductive structure. The unit substrate can comprise a portion of a singulated subpanel substrate of a panel substrate. Other examples and related methods are also disclosed herein.

16 Claims, 23 Drawing Sheets

Related U.S. Application Data

(60) Provisional application No. 62/895,196, filed on Sep. 3, 2019.

(51) Int. Cl.

| | |
| --- | --- |
| *H01L 23/00* | (2006.01) |
| *H01L 23/31* | (2006.01) |
| *H01L 23/538* | (2006.01) |

(52) U.S. Cl.
CPC .......... *H01L 23/5389* (2013.01); *H01L 24/05* (2013.01); *H01L 24/12* (2013.01); *H01L 24/19* (2013.01); *H01L 24/82* (2013.01); *H01L 2224/04105* (2013.01); *H01L 2224/05008* (2013.01); *H01L 2224/12105* (2013.01)

(58) Field of Classification Search
CPC ......... H01L 24/12; H01L 24/19; H01L 24/82; H01L 2224/04105; H01L 2224/05008; H01L 2224/12105
See application file for complete search history.

(56) References Cited

U.S. PATENT DOCUMENTS

| | | | |
| --- | --- | --- | --- |
| 9,378,983 | B2 | 6/2016 | Choi et al. |
| 9,543,242 | B1 | 1/2017 | Kelly et al. |
| 10,424,524 | B2 | 9/2019 | Shen et al. |
| 11,244,923 | B2 | 2/2022 | Huemoeller |
| 2006/0013680 | A1 | 1/2006 | Haba et al. |
| 2008/0157358 | A1 | 7/2008 | Yang |
| 2010/0301474 | A1 | 12/2010 | Yang |
| 2011/0053318 | A1 | 3/2011 | Hu |
| 2011/0266693 | A1 | 11/2011 | Simmons-Matthews et al. |
| 2012/0187568 | A1 | 7/2012 | Lin et al. |
| 2012/0280374 | A1 | 11/2012 | Choi et al. |
| 2013/0029457 | A1 | 1/2013 | Simmons-Matthews |
| 2013/0241039 | A1 | 9/2013 | Choi et al. |
| 2014/0077361 | A1 | 3/2014 | Lin et al. |
| 2014/0235000 | A1 | 8/2014 | Kim et al. |
| 2015/0243575 | A1 | 8/2015 | Strothmann et al. |
| 2015/0255431 | A1 | 9/2015 | Su et al. |
| 2015/0318262 | A1 | 11/2015 | Gu et al. |
| 2017/0025397 | A1 | 1/2017 | Hung et al. |
| 2017/0117200 | A1 | 4/2017 | Kim et al. |
| 2017/0141046 | A1 | 5/2017 | Jeong et al. |
| 2017/0250158 | A1 | 8/2017 | Chinnusamy et al. |
| 2018/0012776 | A1 | 1/2018 | Ross et al. |
| 2018/0114749 | A1* | 4/2018 | Dimaano, Jr. .... H01L 23/49838 |
| 2019/0006195 | A1 | 1/2019 | Qu et al. |
| 2019/0103365 | A1 | 4/2019 | Singh et al. |
| 2019/0252278 | A1* | 8/2019 | Shen ....................... H01L 24/20 |
| 2020/0075540 | A1* | 3/2020 | Lu ..................... H01L 23/49822 |
| 2020/0083189 | A1 | 3/2020 | Chen et al. |
| 2020/0185355 | A1 | 6/2020 | Huemoeller |
| 2021/0066093 | A1 | 3/2021 | Kim et al. |
| 2021/0265182 | A1 | 8/2021 | Baloglu et al. |
| 2021/0265192 | A1 | 8/2021 | Baloglu et al. |

OTHER PUBLICATIONS

Office Action for China Application No. 202011533314.X mailed May 31, 2024.

Office Action for Korean Application No. 10-2021-0004110 mailed Nov. 7, 2024.

Office Action for Taiwan Application No. 109141078 mailed Sep. 25, 2024.

Office Action for Taiwan Application No. 109141078 mailed Jan. 22, 2025.

* cited by examiner

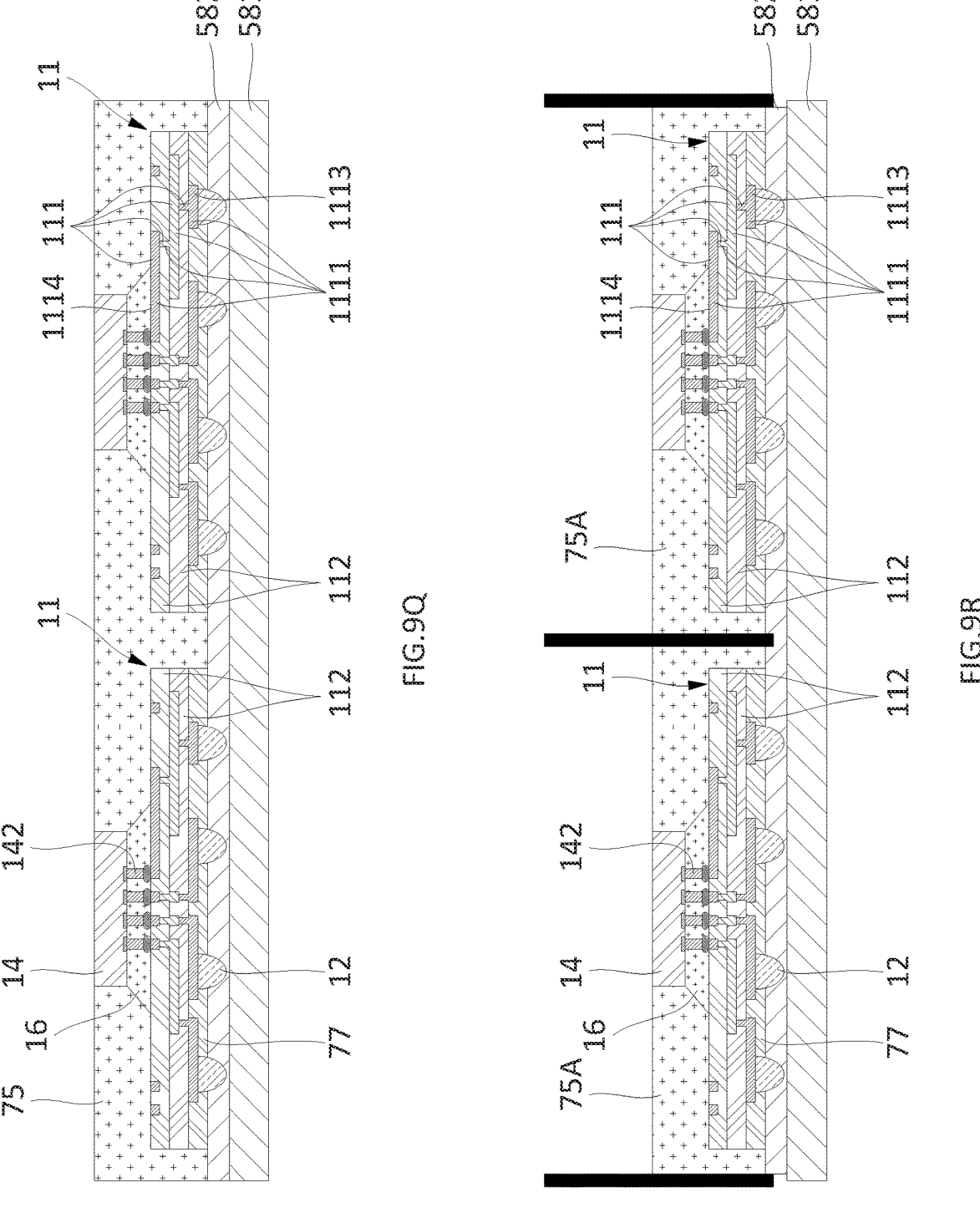

SEMICONDUCTOR DEVICES AND METHODS OF MANUFACTURING SEMICONDUCTOR DEVICES

CROSS-REFERENCE TO RELATED APPLICATIONS

The present application is a continuation of U.S. application Ser. No. 16/748,956 filed Jan. 22, 2020, which in turn claims the benefit of U.S. Provisional Application No. 62/895,196 filed Sep. 3, 2019 and titled "SEMICONDUC-TOR DEVICES AND METHODS OF MANUFACTUR-ING SEMICONDUCTOR DEVICES". Said application Ser. No. 16/748,956 and said Application No. 62/895,196 are hereby incorporated herein by reference in their entire-ties.

TECHNICAL FIELD

The present disclosure relates, in general, to electronic devices, and more particularly, to semiconductor devices and methods of manufacturing semiconductor devices.

BACKGROUND

Prior semiconductor packages and methods for forming or providing semiconductor packages are inadequate, for example resulting in excess cost, decreased reliability, rela-tively low performance, or package sizes that are too large. Further limitations and disadvantages of conventional and traditional approaches will become apparent to one of skill in the art, through comparison of such approaches with the present disclosure and reference to the drawings.

Figure 1:
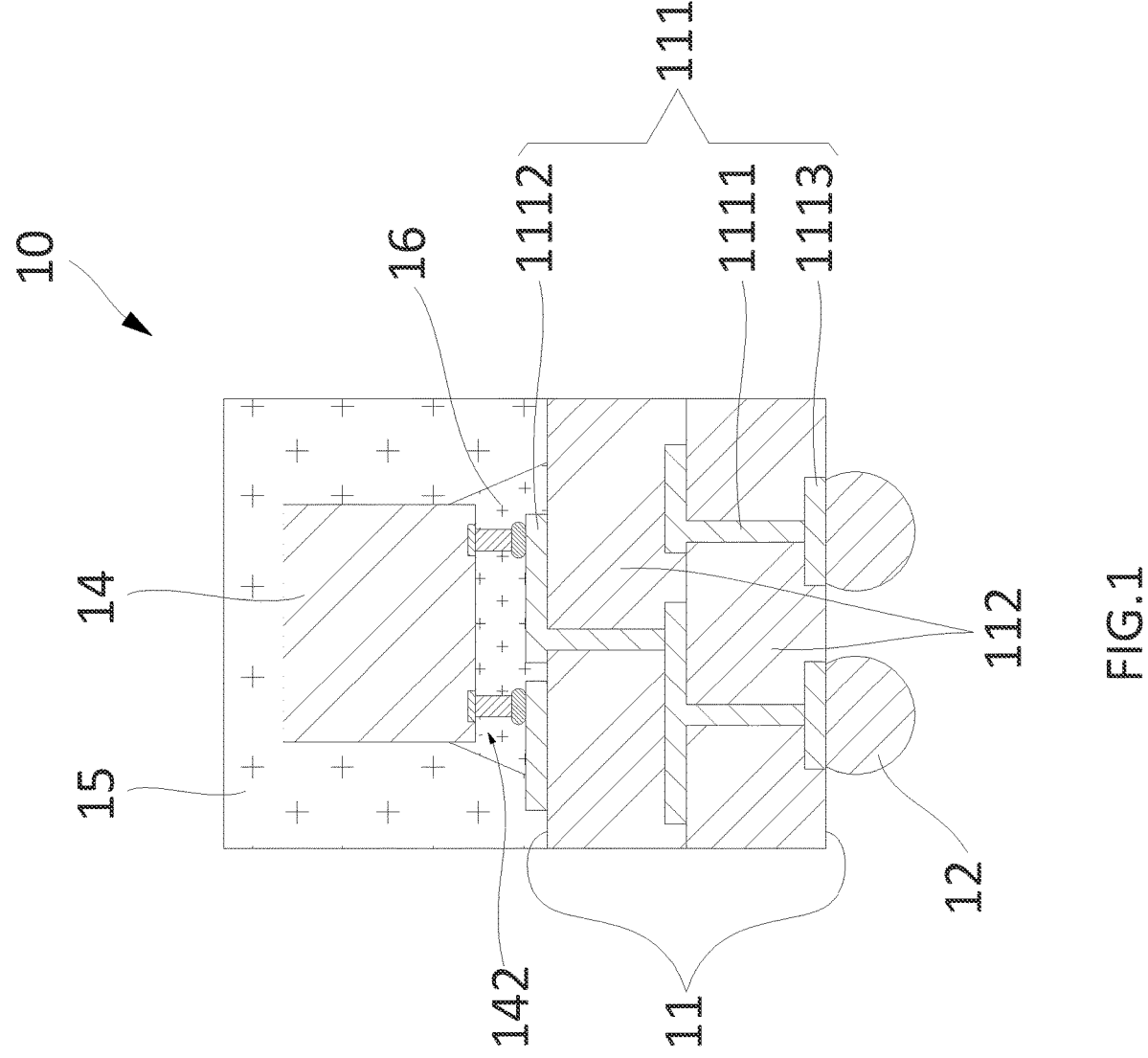
FIG. 1 shows a cross-sectional view of an example semiconductor device.

The following discussion provides various examples of semiconductor devices and methods of manufacturing semi-conductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set $\{(x), (y), (x, y)\}$. As another example, "x, y, or z" means any element of the seven-element set $\{(x), (y), (z), (x, y), (x, z), (y, z), (x, y, z)\}$.

The terms "comprises," "comprising," "includes," or "including," are "open ended" terms and specify the pres-ence of stated features, but do not preclude the presence or addition of one or more other features. The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements.

DESCRIPTION

Several examples are included in the present disclosure. Such examples may be found in the figures, in the claims, or in the description of the present disclosure. In one example, a method to manufacture a semiconductor device comprises providing a subpanel substrate on a subpanel base, the subpanel substrate comprising a dielectric structure and a conductive structure, wherein the subpanel substrate com-prises a singulated portion of a panel substrate, providing a first electronic component on a first side of the subpanel substrate and electrically coupled to a first portion of the conductive structure, and a second electronic component on the first side of the subpanel substrate and electrically coupled to a second portion of the conductive structure, removing the subpanel base, providing a first external inter-connect on a second side of the subpanel substrate and electrically coupled to the first portion of the conductive structure, and a second external interconnect on the second side of the subpanel substrate and electrically coupled to the second portion of the conductive structure, and singulating the subpanel substrate to provide individual unit substrates.

In another example, a method to manufacture as semi-conductor device comprises receiving a first subpanel sub-strate on a first subpanel base, the first subpanel substrate comprising a subpanel dielectric structure, a subpanel con-ductive structure coupled with the subpanel dielectric struc-ture, a first unit substrate comprising a first unit conductive structure comprising a first portion of the subpanel conductive structure, and a first unit dielectric structure comprising a first portion of the subpanel dielectric structure, a second unit substrate electrically coupled with the first unit substrate and comprising a second unit conductive structure comprising a second portion of the subpanel conductive structure, and a second unit dielectric structure comprising a second portion of the subpanel dielectric structure, coupling a first electronic component with the first unit substrate, coupling a second electronic component with the second unit substrate, and singulating semiconductor devices from the first subpanel substrate, the semiconductor devices comprising a first semiconductor device comprising the first unit substrate and the first electronic component, and a second semiconductor device comprising the second unit substrate and the second electronic component.

In a further example, a semiconductor device comprises a unit substrate comprising a unit conductive structure and a unit dielectric structure, and an electronic component coupled to the unit conductive structure, wherein the unit substrate comprises a portion of a singulated subpanel substrate of a panel substrate.

FIG. 1 shows a cross-sectional view of an example semiconductor device 10. In the example shown in FIG. 1, semiconductor device 10 can comprise unit substrate 11, external interconnects 12, electronic component 14, unit body 15 and (optional) underfill 16.

Unit substrate 11 can comprise conductive structure 111 including conductive paths 1111, top terminals 1112 and bottom terminals 1113, and dielectric structure 112. Electronic component 14 can comprise or can be coupled to device interconnects 142.

Unit substrate 11, external interconnects 12, unit body 15 and (optional) underfill 16 can be referred to as a semiconductor package and can protect electronic component 14 from external elements or environmental exposure. In some examples, semiconductor package can provide electrical coupling between external device and external interconnects.

Figure 2:
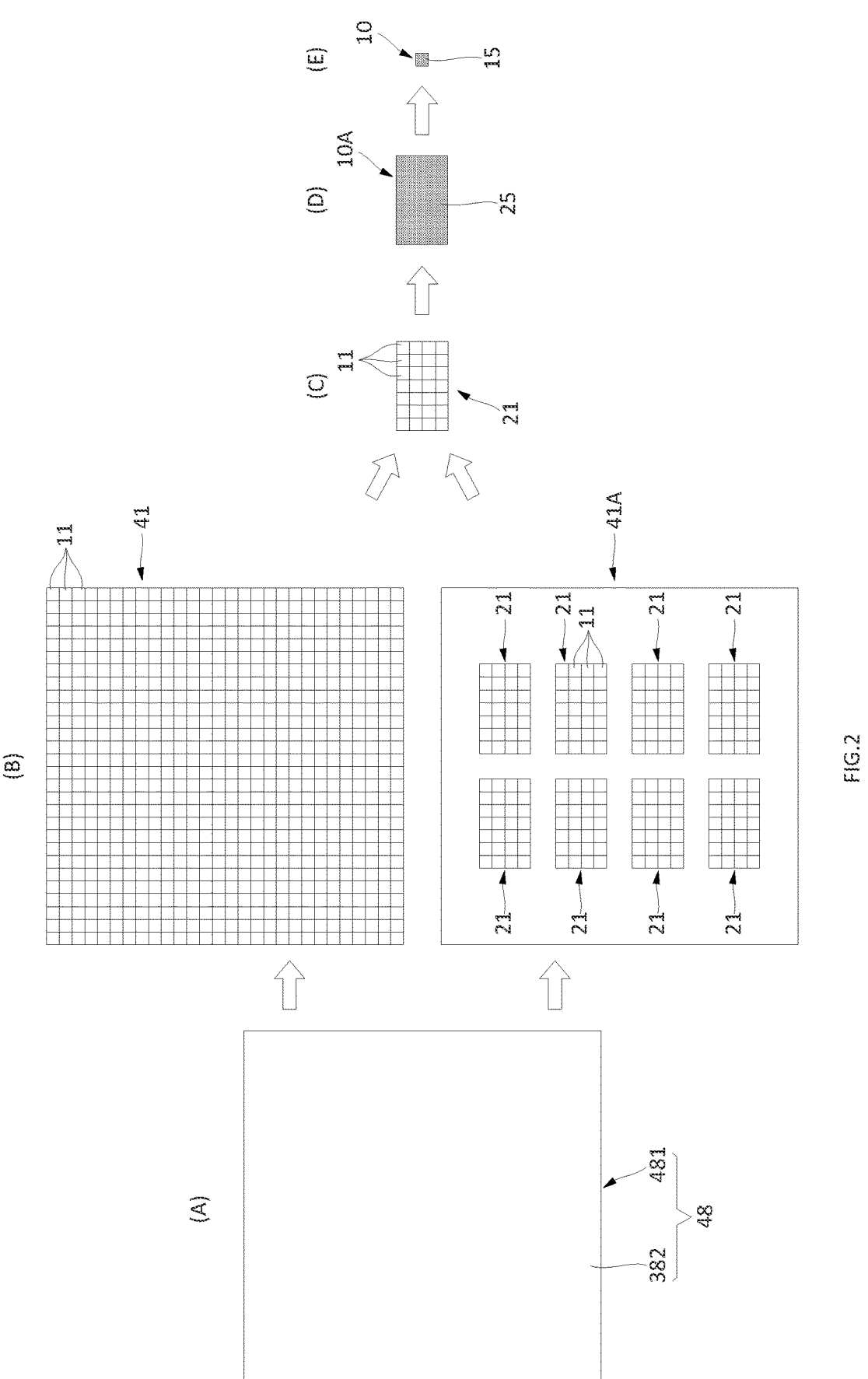
FIG. 2 shows a schematic view of an example method for manufacturing an example semiconductor device.

FIG. 2 shows a schematic view of an example method for manufacturing an example semiconductor device 10. In the example shown in FIG. 2, the method for manufacturing semiconductor device 10 can comprise the steps of (A) preparing panel 48, (B) forming or providing panel substrate 41 or 41A, (C) singulating or separating subpanel substrate 21 from panel substrate 41, (D) assembling subpanel device array 10A, and (E) singulating or separating unit semiconductor device 10 from subpanel device array 10A.

In some examples, preparing panel 48 can comprise preparing substantially square or rectangular panel base 481. In some examples, preparing panel 48 can comprise forming, providing, or applying temporary adhesive 382 on panel base 481. In some examples, the forming or providing of panel substrate 41 or 41A can comprise forming or providing panel substrate 41 or 41A on temporary adhesive 382. In some examples, panel substrate 41 or 41A can be referred to as a redistribution layer (RDL) panel. In some examples, the singulation or separation of subpanel substrate 21 can comprise cutting or separating multiple subpanel substrates 21 from panel substrate 41 or 41A. In some examples, subpanel substrate 21 can be referred to as an array of redistribution layer (RDL) substrates, or an RDL array. In some examples, the assembling of subpanel device array 10A can comprise attaching multiple electronic components on subpanel substrate 21 and covering multiple electronic components with subpanel body 25. In some examples, the singulating and separating of unit semiconductor device 10 can comprise singulating or sawing multiple unit semiconductor devices 10 from subpanel device array 10A. In some examples, panel substrate 41 can be received on panel base 481. The panel base 481 can comprise a first subpanel base 381 and a second subpanel base 381 integral with the first subpanel base 381. The panel substrate 41 an comprise a first subpanel substrate 21 on the first subpanel base 381, and second subpanel substrate 21 on the second subpanel base 381. The first and second subpanel substrates 21 an be electrically coupled.

In some examples, panel substrate 41 can comprise, for example, about 28 by 28 unit substrates 11. In some examples, subpanel substrate 21 can comprise, for example, about 4 by 7 unit substrates 11. In some examples, panel substrate 41 can comprise, for example, about 7 by 4 subpanel substrates 21. The number of subpanel substrates 21 or the number of unit substrates 11 stated in the present disclosure are be provided herein by way of example for a better understanding of the present disclosure and can be smaller than or greater than those stated in the present disclosure. In the example shown in FIG. 2, although unit substrates 11 can be located on the entire region of panel substrate 41, this is not a limitation of the present disclosure. In some examples, as shown with respect to panel substrate 41A, unit substrates 11 can be located only on inner areas of respective subpanel substrates 21 that will be separated from panel substrate 41A, leaving areas between subpanel substrates 21 devoid of unit substrates 11. In some examples, a unit substrate 11 can comprise a portion of a singulated subpanel substrate 21 of a panel substrate 41 or 41A.

In some examples, subpanel substrate 21 can have a substantially rectangular or square area. In some examples, a subpanel substrate 21 can have a strip array form-factor, and panel substrate 41 or 41A can have a side dimension of at least 400 mm. In some examples, subpanel substrate 21 can have a substantially circular plane. In some examples, subpanel substrate 21 can be omitted in the manufacture of semiconductor device and will be further described below.

Figures 3A, 3B:
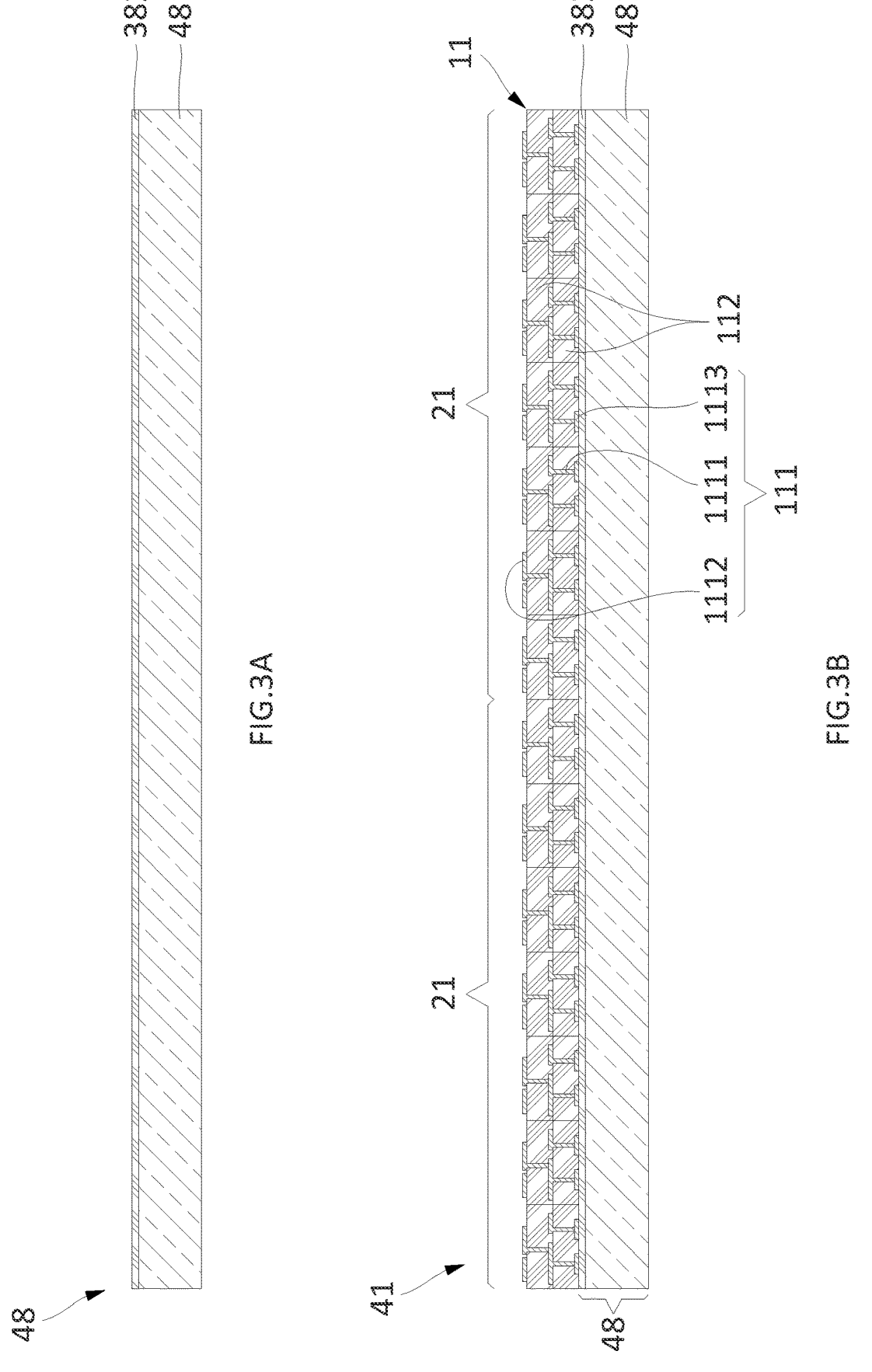
FIGS. 3A to 3G show cross-sectional views of an example method for manufacturing an example semiconductor device.

FIGS. 3A to 3G show cross-sectional views of an example method for manufacturing semiconductor device 10. FIG. 2 can be correlated with the different stages of FIGS. 3A to 3G. FIG. 3A shows a cross-sectional view of an early stage of manufacture for semiconductor device 10.

In the example shown in FIG. 3A, substantially planar panel 48 can be prepared or provided. In some examples, panel 48 can comprise panel base 481 and temporary adhesive 382.

Panel base 481 can have a substantially planar top side and a substantially planar bottom side opposite to the top side. Panel base 481 can comprise or be referred to as a glass panel, a silicon panel, a ceramic panel, or a metal panel. In some examples, panel base 481 can have side dimensions of, for example, about 400 millimeters (mm) by 400 mm to about 2880 mm by 3130 mm. Panel base 481 can support panel substrate 41 during the manufacturing process and can facilitate handling of panel substrate 41. Portions of panel base 481 can also support subpanel device array 10A during its assembly process and can facilitate handling of subpanel device array 10A.

Temporary adhesive 382 can be provided on panel base 481. In some examples, temporary adhesive 382 can comprise or can be referred to as, for example, a releasable layer. In some examples, temporary adhesive 382 can comprise or be referred to as a photo-releasable layer configured to be releasable from subpanel substrate 21 after reacting with light, such as ultraviolet light or laser light. In some examples, temporary adhesive 382 can comprise a thermo-releasable layer, a thermocurable adhesive resin, or a thermoplastic resin.

In some examples, temporary adhesive 382 can be coated on panel base 481 using spin coating, spray coating, or slit die coating. Temporary adhesive 382 can have a thickness in the range from about 0.5 micrometers ($\mu$m) to about 10 $\mu$m.

Temporary adhesive 382 can offer adhesion for facilitating preparing panel substrate 41, for singulating subpanel substrate 21, or for assembling subpanel device array 10A. In some examples, temporary adhesive 382 can have chemical resistance and heat resistance so as not to be damaged during preparing panel substrate 41, singulation of subpanel substrate 21, or assembly of subpanel device array 10A.

In some examples, temporary adhesive 382 can lose its adhesiveness by heat or light to allow subpanel substrate 21 or unit substrate 11 to be easily released in a subsequent process. In some examples, the adhesiveness of temporary adhesive 382 can be removed by heat or light energy of laser beam irradiated into a glass panel.

FIG. 3B shows a cross-sectional view a later stage of manufacture semiconductor device 10. In the example shown in FIG. 3B, panel substrate 41 can be formed or provided on panel base 481. In some examples, panel substrate 41 can comprise multiple unit substrates 11 or multiple subpanel substrates 21 (refer to FIG. 2).

In some examples, a seed layer can be formed or provided on panel base 481. In some examples, seed layer can be formed or provided by sputtering. In some examples, titanium (Ti) can be sputtered and copper (Cu) can then be sputtered on titanium (Ti) to finally forming or providing seed layer. Seed layer can have a thickness in the range from about 0.1 $\mu$m to about 1 $\mu$m. Such seed layer can allow power to be applied in a subsequent process to form portions of conductive structure 111. In some examples, temporary adhesive 382 can be formed or provided on panel base 481 and seed layer can then be formed or provided on temporary adhesive 382.

Dielectric structure 112 can be coated on seed layer. In some examples, dielectric structure 112 can comprise one or more dielectric layers formed or provided by spin coating, spray coating or slit die coating. In some examples, dielectric structure 112 can comprise or can be referred to as, for example, polyimide, benzocyclobutene, or polybenzoxazole. Dielectric structure 112 can have a thickness in the range from about 2 $\mu$m to about 20 $\mu$m. Dielectric structure 112 can support conductive structure 111 and can serve as a dielectric layer.

In some examples, a mask having a pattern can be positioned on dielectric structure 112 and light can then be irradiated onto the mask to transfer the pattern to dielectric structure 112. In some examples, such a photolithography process can be performed by stepper equipment. A pattern-transferred portion or a non-transferred portion of dielectric structure 112 can be developed so that dielectric structure 112 can have a pattern or opening. In some examples, such a developing process can be performed by spin developing equipment. Dielectric structure 112 having an opening can be used as a mask to expose a region of a seed layer through opening of dielectric structure 112. The region of seed layer can be exposed through an opening of dielectric structure 112 to supply power through the seed layer in a subsequent plating process.

In some examples, residual polymer remaining in opening of dielectric structure 112 can be removed to clean the surface of seed layer inside opening of dielectric structure

112. In some examples, residual polymer can be removed by O$_2$ descum and spin rinse dry (SRD) equipment.

Conductive structure 111 can comprise one or more conductive layers formed or provided on panel 48 inter-stacked with the one or more dielectric layers of dielectric structure 112. For example, bottom terminals 1113 of conductive structure 111, can be formed or provided on the seed layer. Bottom terminals 1113 can comprise or can be referred to as, for example, pads, lands, Under Bumped Metallization (UBM) pads, or pillars. In some examples, copper (Cu) or gold (Au), nickel (Ni), and copper (Cu) can be sequentially plated on a region of seed layer inside opening of dielectric structure 112 to form or provide bottom terminals 1113. Bottom terminals 1113 can have a line/space/thickness in the range from about 0.5/0.5/0.5 $\mu$m to about 10/10/10 $\mu$m, respectively. In some examples, bottom terminals 1113 can be formed or provided by electroplating equipment containing a copper (Cu) solution, nickel (Ni), or a gold (Au) solution, respectively. External interconnects 12 can be connected to bottom terminals 1113 in a subsequent process.

Further seed layers, dielectric layers of dielectric structure 112, and conductive layers of conductive structure 111, can be further provided in a similar manner to that described above to form conductive paths 1111 and top terminals 1112 of conductive structure 111 traversing through or on the dielectric layers of dielectric structure 112. Conductive paths 1111 can comprise or can be referred to as, for example, traces, vias, downward vias, or patterns. In some examples, conductive paths 1111 generally can be positioned inside or on respective dielectric layers of dielectric structure 112. In some examples, top terminals 1112 can comprise or can be referred to as, for example, pads, lands, bumps, copper (Cu), nickel (Ni), or gold (Au) plated Under Bumped Metallization (UBM) pads, vias, downward vias, or pillars. Top terminals 1112 can be exposed from dielectric structure 112 and can protrude above it in some examples. As seen in FIG. 1, conductive paths 1111 can be electrically connected to bottom terminals 1113 and top terminals 1112, and top terminals 1112 can be electrically connected to electronic component 14 and conductive paths 1111. In some examples, a bonding material, such as solder or gold, further can be located on top terminals 1112. In some examples, a stencil having openings corresponding to top terminals 1112 can be positioned, solder paste can be positioned on stencil, and a predetermined amount of solder paste can then be positioned on top terminals 1112 by a subsequent squeezing process using a blade. In some examples, solder can be plated on top terminals 1112, followed by reflowing.

Although FIG. 3B shows 3-layered conductive structure 111 (e.g., one-layered bottom terminals 1113, one-layered conductive path 1111, and one-layered top terminals 1112) and 2-layered dielectric structure 112, this is not a limitation of the present disclosure. In some examples, respective numbers of layers of conductive structure 111 and dielectric structure 112 can be greater than or smaller than those stated above.

In some examples, although FIG. 3B shows a section of panel substrate 41 comprising 14 unit substrates 11 or two subpanel substrates 21, this is not a limitation of the present disclosure. In some examples, respective numbers of unit substrate 11 and subpanel substrate 21 can be greater than or smaller than those stated shown in individual figures. In some examples, a subpanel substrate 21 can comprise a subpanel conductive structure 111 and the subpanel conductive 111 structure can comprise a unit conductive structure 11.

In some examples, panel substrate 41 or its respective subpanel substrates 21 or unit substrates 11 can be redistribution layer ("RDL") substrates. RDL substrates can comprise one or more conductive redistribution layers and one or more dielectric layers that (a) can be formed or provided layer by layer over an electronic component to which the RDL substrate can be electrically coupled, or (b) can be formed or provided layer by layer over a carrier that can be entirely removed or at least partially removed after the electronic component and the RDL substrate are coupled together. RDL substrates can be manufactured layer by layer as a panel-level substrate on a rectangular or square panel carrier in a panel-level process. RDL substrates can be formed or provided in an additive buildup process that can include one or more dielectric layers alternatingly stacked with one or more conductive layers that define respective conductive redistribution patterns or traces configured to collectively (a) fan-out electrical traces outside the footprint of the electronic component, or (b) fan-in electrical traces within the footprint of the electronic component. The conductive patterns can be formed or provided using a plating process such as, for example, an electroplating process or an electroless plating process. The conductive patterns can comprise an electrically conductive material such as, for example, copper or other plateable metal. The locations of the conductive patterns can be made using a photo-patterning process such as, for example, a photolithography process and a photoresist material to form a photolithographic mask. The dielectric layers of the RDL substrate can be patterned with a photo-patterning process, which can include a photolithographic mask through which light is exposed to photo-pattern desired features such as vias in the dielectric layers. Thus, the dielectric layers can be made from photo-definable organic dielectric materials such as, for example, polyimide (PI), benzocyclobutene (BCB), or polybenzoxazole (PBO). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, that could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in some examples the dielectric materials of the RDL substrates can comprise one or more inorganic dielectric layers. Some examples of inorganic dielectric layer(s) can comprise silicon nitride (Si3N4), silicon oxide (SiO2), or SiON. The inorganic dielectric layer(s) can be formed or provided by growing the inorganic dielectric layers using an oxidation or nitridization process instead using photo-defined organic dielectric materials. Such inorganic dielectric layers can be filler-fee, without strands, weaves, or other dissimilar inorganic particles. In some examples, the RDL substrates can omit a permanent core structure or carrier such as, for example, a dielectric material comprising bismaleimide triazine (BT) or FR4 and these types of RDL substrates can be referred to as a coreless substrate.

In some examples, panel substrate 41 or its respective subpanel substrates 21 or unit substrates 11 can be a pre-formed substrate. The pre-formed substrate can be manufactured prior to attachment to an electronic component and can comprise dielectric layers between respective conductive layers. The conductive layers can comprise copper and can be formed or provided using an electroplating process.

The dielectric layers can be relatively thicker non-photo-definable layers that can be attached as a pre-formed film rather than as a liquid and can include a resin with fillers such as strands, weaves, or other inorganic particles for rigidity or structural support. Since the dielectric layers are non-photo-definable, features such as vias or openings can be formed or provided by using a drill or laser. In some examples, the dielectric layers can comprise a prepreg material or Ajinomoto Buildup Film (ABF). The pre-formed substrate can include a permanent core structure or carrier such as, for example, a dielectric material comprising bismaleimide triazine (BT) or a glass-reinforced epoxy laminate material such as FR4, and dielectric and conductive layers can be formed or provided on the permanent core structure. In some examples, the pre-formed substrate can be a coreless substrate and omits the permanent core structure, and the dielectric and conductive layers can be formed or provided on a sacrificial carrier that is removed after formation of the dielectric and conductive layers and before attachment to the electronic component. The pre-formed substrate can rereferred to as a printed circuit board (PCB) or a laminate substrate. Such pre-formed substrate can be formed or provided through a semi-additive or modified-semi-additive process.

Figures 3C, 3D:
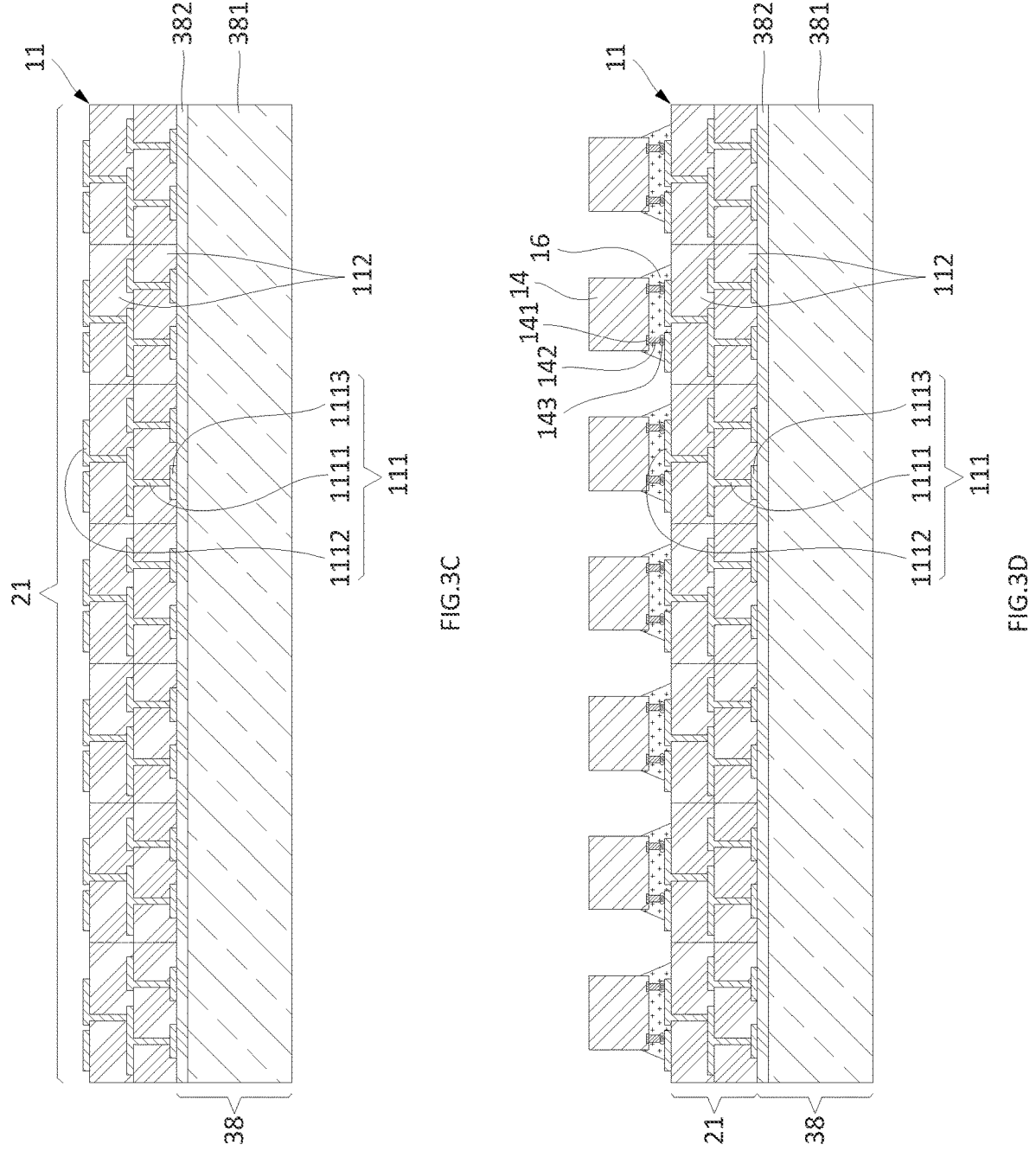

FIG. 3C shows a cross-sectional view of a later stage of manufacture semiconductor device 10. In the example shown in FIG. 3C, subpanel substrate 21 is shown singulated and separated from panel substrate 41. In some examples, if panel substrate 41 comprises, for example, two subpanel substrates 21, then panel substrate 41 can be divided into two subpanel substrates 21. In some examples, if panel substrate 41 comprises, for example, seven subpanel substrates 21, then panel substrate 41 can be divided into seven subpanel substrates 21. In some examples, one subpanel substrate 21 can comprise, for example, seven unit substrates 11, but the present disclosure does not limit the number of unit substrates 11 to seven or any other number. In some examples, panel substrate 41 and panel 48 can be cut together using a blade wheel or laser beam. In this way, subpanel substrate 21 can comprise underlying subpanel base 381 and temporary adhesive layer 382 to facilitate handling of subpanel substrate 21 in the manufacture of subpanel substrate 21. In some examples, since cutting is performed using a blade wheel or laser beam, lateral sides of subpanel substrate 21, temporary adhesive 382, and subpanel base 381 can be coplanar. In some examples, subpanel substrate 21 can be received on subpanel base 381. The subpanel substrate 21 can comprise a subpanel conductive structure 111 and a subpanel dielectric structure 112.

In some examples, the generation of subpanel substrates 21 from panel substrate 41 can permit further processing or assembly of such subpanel substrates 21, leading to semiconductor device 10, using tooling or machinery that normally would not be able to handle the dimensions of panels such as panel substrate 41. Accordingly, panel substrate 41 can be divided or resized by singulation or separation of subpanel substrates 21 into standard form-factors, such as strip array form-factors or wafer/disk form-factors, capable of being processed by conventional or standard-sized equipment used in pre-existing manufacturing lines. In some examples, a first subpanel base 381 and a first subpanel substrate 21 can be singulated from a panel base 481 and a panel substrate 41 or 41A prior to coupling an electronic component 14 to the first subpanel substrate 21.

FIG. 3D shows a cross-sectional view of a later stage of manufacture for semiconductor device 10. In the example shown in FIG. 3D, electronic components 14 can be attached onto subpanel substrate 21. In some examples, subpanel substrate 21 can comprise multiple unit substrates 11. A first unit substrate 11 can comprise a first unit conductive structure 111 comprising a first portion of the subpanel conductive structure 111, and a first unit dielectric structure 112 comprising a first portion of the subpanel dielectric structure 112. A second unit substrate 11 can comprise a second unit conductive structure 111 comprising a second portion of the subpanel conductive structure 111, and a second unit dielectric structure 112 comprising a second portion of the subpanel dielectric structure 112. In some examples, electronic components 14 can be electrically connected to top terminals 1112 of conductive structure 111 of subpanel substrate 21, for example on a first side or a top side of subpanel substrate 21. In some examples, a first electronic component 14 can be electrically coupled to a first portion of conductive structure 111, and a second electronic component 14 can be electrically coupled to s second portion of conductive structure 111. Electronic component 14 can comprise or can be referred to as, for example, a chip, a die, or a package. In some examples, the chip or the die can comprise an integrated circuit die separated from a semiconductor wafer. In some examples, electronic component 14 can comprise a digital signal processor (DSP), a network processor, a power management unit, an audio processor, a radio-frequency (RF) circuit, a wireless baseband system on chip (SoC) processor, a sensor, or an application specific integrated circuit (ASIC). In some examples, electronic component 14 can have a thickness in a range of about 20 μm to about 300 μm. In some examples, electronic component 14 can have a thickness in a range of about 50 μm to about 780 μm.

In some examples, electronic component 14 can comprise device interconnects 142, and device interconnects 142 can be electrically connected to top terminals 1112. In some examples, a first electronic component 14 can be coupled with the first unit substrate 11, and a second electronic component 14 can be coupled with the second unit substrate 11. Device interconnects 142 can comprise or can be referred to as pads, pillars, or bumps of electronic component 14. In some examples, device interconnects 142 can comprise or can be connected to top terminals 1112 through bonding tips or materials, such as solder. In some examples, electronic component 14 can be electrically connected to top terminals 1112 using a mass reflow process, a thermal compression process, or a laser assist bonding process. In some examples, device interconnects 142 can have a thickness in the range from about 1 μm to about 50 μm. There can be examples where electronic components 14 can be attached to subpanel substrate 21 with device interconnects 142 facing upward, and device interconnects 142 can be coupled to substrate top terminals 1112 through wirebonds.

In some examples, underfill 16 can be filled between subpanel substrate 21 and electronic component 14. Underfill 16 can comprise or can be referred to as a capillary underfill, a no-flow underfill, also called a non-conductive paste (NCP), molded underfill (MUF), or a non-conductive film (NCF). In some examples, underfill 16 can be a capillary underfill that can fill a gap between electronic component 14 and subpanel substrate 21 after electronic component 14 is electrically connected to subpanel substrate 21. In some examples, underfill 16 can be a no-flow underfill that can be pressed by electronic component 14 after being coated on subpanel substrate 21. In some examples, after underfill 16 is coated on device interconnects 142 of electronic component 14, underfill 16 can be attached onto subpanel substrate 21 while electronic component 14 presses underfill 16. In some examples, underfill 16 can be an MUF that can fill the gap between electronic component 14 and subpanel substrate 21 and can cover electronic component 14. In some examples, underfill 16 can be a non-conductive film (NCF) that can be positioned on top terminals 1112 of subpanel substrate 21 in form of a film and then be pressed by electronic component 14, followed by simultaneously performing a solder reflow process and an underfill curing process. In this way, underfill 16 can be positioned between electronic component 14 and subpanel substrate 21 to cover device interconnects 142 and to allow electronic component 14 and subpanel substrate 21 to be mechanically coupled to each other. Underfill 16 can redistribute stress and distortion due to a difference between a coefficient of thermal expansion (CTE) of electronic component 14, for example 2-4 ppm/° C., and a CTE of subpanel substrate 21, for example 20-30 ppm/° C. Underfill 16 can prevent physical or chemical shocks from being transferred to electronic component 14 while preventing moisture infiltration and can rapidly transfer heat from electronic component 14 to an exterior side of underfill 16.

Figures 3E, 3F:
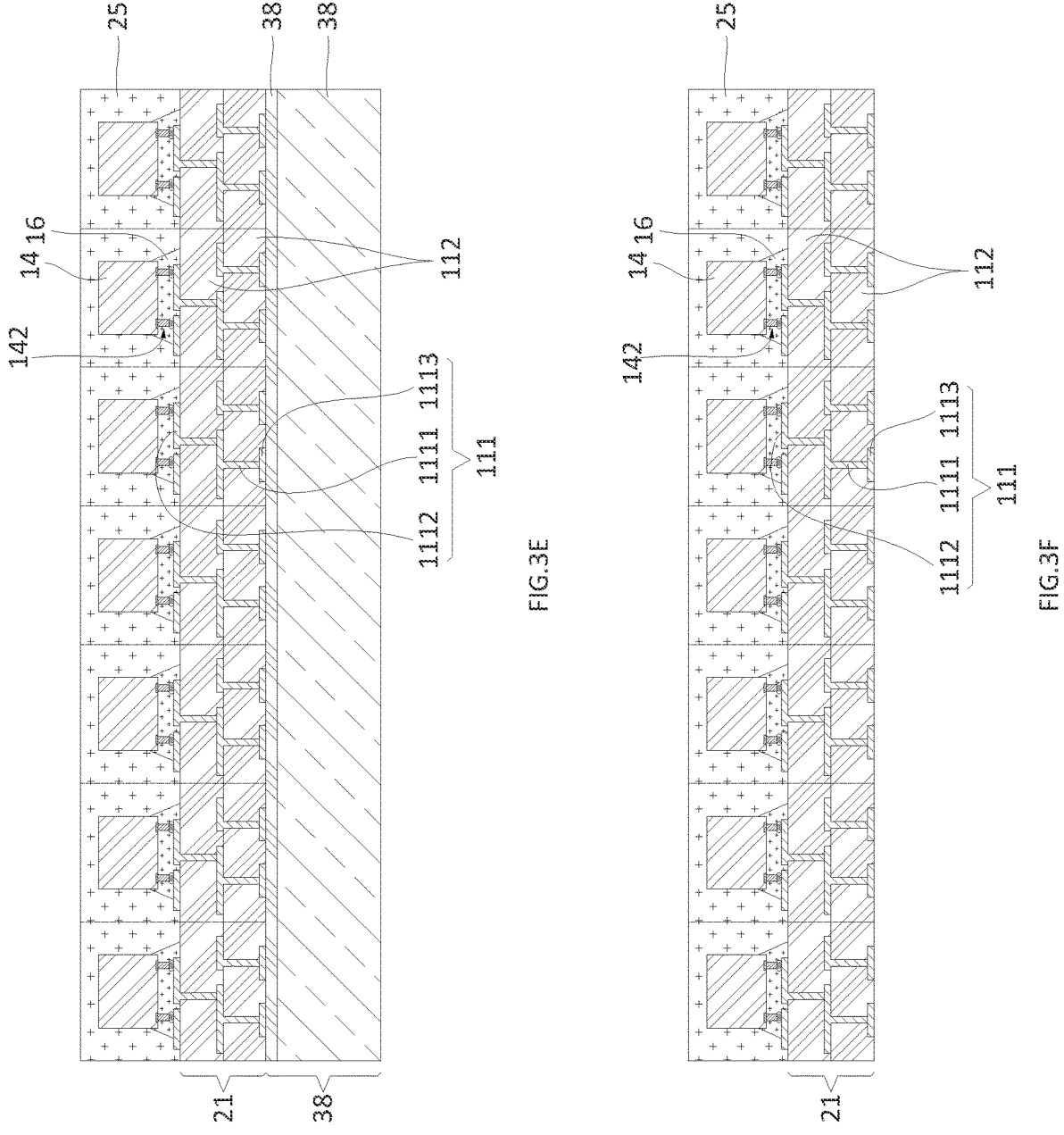

FIG. 3E shows a cross-sectional view of a later stage of manufacture for semiconductor device 10. In the example shown in FIG. 3E, subpanel body 25 can cover electronic component 14 or underfill 16 located on subpanel substrate 21. Subpanel body 25 can comprise or define multiple unit bodies 15 when semiconductor devices 10 are later singulated. In some examples, subpanel body 25 can be on a top side of subpanel substrate 21 contacting a lateral side of a first electronic component 14 and a lateral side of a second electronic component 14. In some examples, a top side of electronic component 14 and a top side of subpanel body 25 can be coplanar. In some examples, the top side of electronic component 14 can be exposed through the top side of subpanel body 25. Subpanel body 25 can comprise or can be referred to as an encapsulant, a mold compound, a resin, a sealant, or an organic body. In some examples, subpanel body 25 can be formed or provided using compression molding, transfer molding, liquid-phase encapsulant molding, vacuum lamination, paste printing, or film assist molding. In some examples, subpanel body 25 can have a thickness in the range from about 80 μm to about 1500 μm. Subpanel body 25 can protect electronic component 14 from external elements or environmental exposure. Subpanel body 25 can rapidly emit heat to an exterior side of electronic component 14. In some examples, underfill 16 can comprise or be integral with a portion of the material of subpanel body 25, for instance when underfill 16 is a MUF.

FIG. 3F shows a cross-sectional view of a later stage of manufacture for semiconductor device 10. In the example shown in FIG. 3F, subpanel carrier 38 can be removed from subpanel substrate 21. In some examples, when temporary adhesive 382 is positioned between subpanel substrate 21 and subpanel base 381, heat or light such as a laser beam can be supplied to temporary adhesive 382 to remove adhesiveness of temporary adhesive 382 to release subpanel base 381 from subpanel substrate 21. In some examples, subpanel base 381 can be peeled from subpanel substrate 21 using a mechanical force. In some examples, subpanel base 381 can be removed by a mechanical polishing or chemical etching process. In some examples, prior to singulating, subpanel base 381 can be removed, for example wherein adhesive 382 or a temporary adhesive 382 between subpanel base 381 and subpanel substrate 21 is photo-releasable, and subpanel base 381 can be removed by degrading adhesion of adhesive 382 or temporary adhesive 382 by exposure to light. In some examples, the seed layer can be removed from bottom terminals 1113 and dielectric structure 112 located in subpanel substrate 21. In some examples, the seed layer located on bottom sides of bottom terminals 1113 can be removed by a chemical etching process. Accordingly, bottom sides of bottom terminals 1113 can be exposed through dielectric structure 112.

Figure 3G:
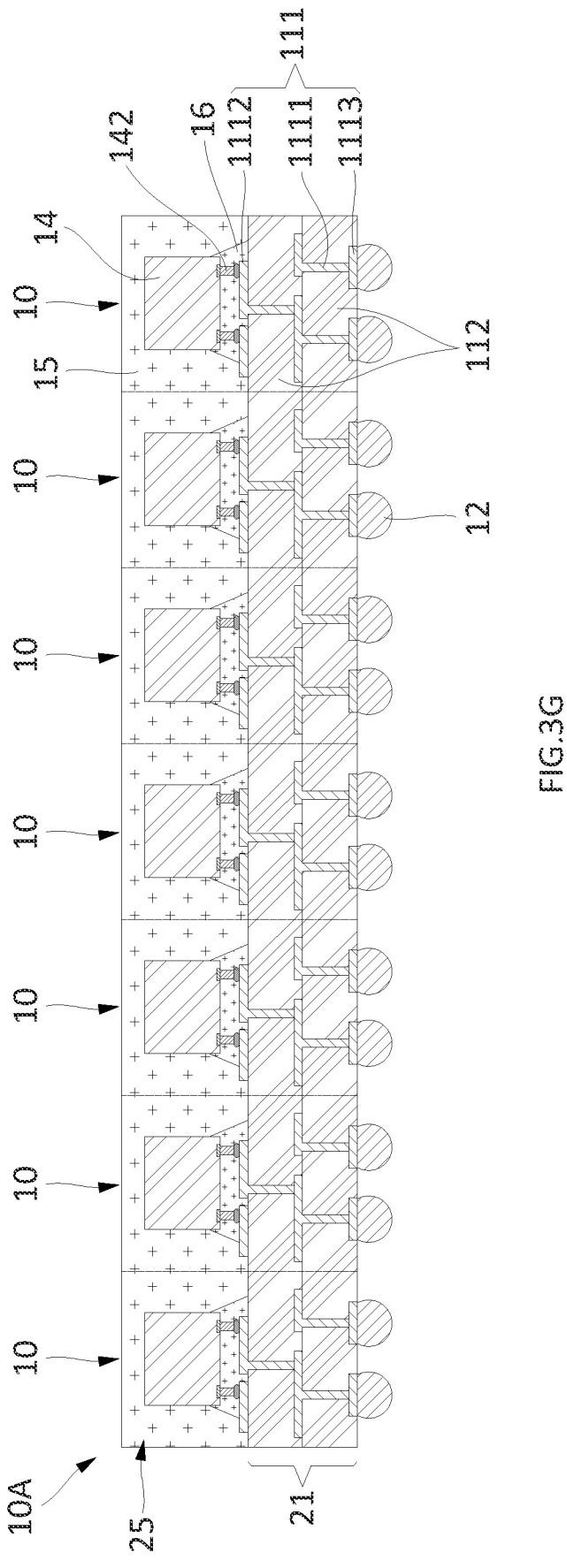

FIG. 3G shows a cross-sectional view of a later stage of manufacture for semiconductor device 10. In the example shown in FIG. 3G, external interconnects 12 can be attached or formed or provided on subpanel substrate 21. In some examples, subpanel base 381 can be removed prior to providing external interconnects 12 on subpanel substrate 21. In some examples, a first external interconnect 12 can be on a second side or a bottom side of subpanel substrate 21 and electrically coupled to a first portion of conductive structure 111, and a second external interconnect 12 can be on the second side or the bottom side of subpanel substrate 21 and electrically coupled to a second portion of conductive structure 111. In some examples, external interconnects 12 can be connected to bottom terminals 1113 of conductive structure 111 provided on a second side or a bottom side of subpanel substrate 21 or unit substrates 11. External interconnects 12 can comprise or can be referred to as pads, lands, bumps, or solder balls. After external interconnects 12 are positioned on bottom terminals 1113, external interconnects 12 can be electrically connected to bottom terminals 1113 using a mass reflow process or a laser assist bonding process. External interconnects 12 can have a diameter in the range from about 20 µm to about 400 µm. External interconnects 12 can electrically connect semiconductor device 10 to an external device.

In some examples, singulation can be performed along the dotted lines shown in FIG. 3G to generate individual semiconductor devices 10. Subpanel substrate 21 can be singulated into individual unit substrates 11 as shown for example in FIG. 4 or FIG. 5. In some examples, the semiconductor devices 10 can comprise a first semiconductor device 10 comprising a first unit substrate 11 and a first electronic component 14, and a second semiconductor device 10 comprising a second unit substrate 11 and a second electronic component 14. In some examples, subpanel body 25 and subpanel substrate 21 can be subjected to singulation or sawing using a blade wheel or laser beam to provide individual semiconductor devices 10. In the example shown in FIG. 3G, seven semiconductor devices 10, as an example, can be provided by singulation. In this way, each of individual semiconductor devices 10 can comprise unit substrate 11 and unit body 15, and lateral sides of unit substrate 11, and lateral sides of unit body 15 can be coplanar.

Figure 4:
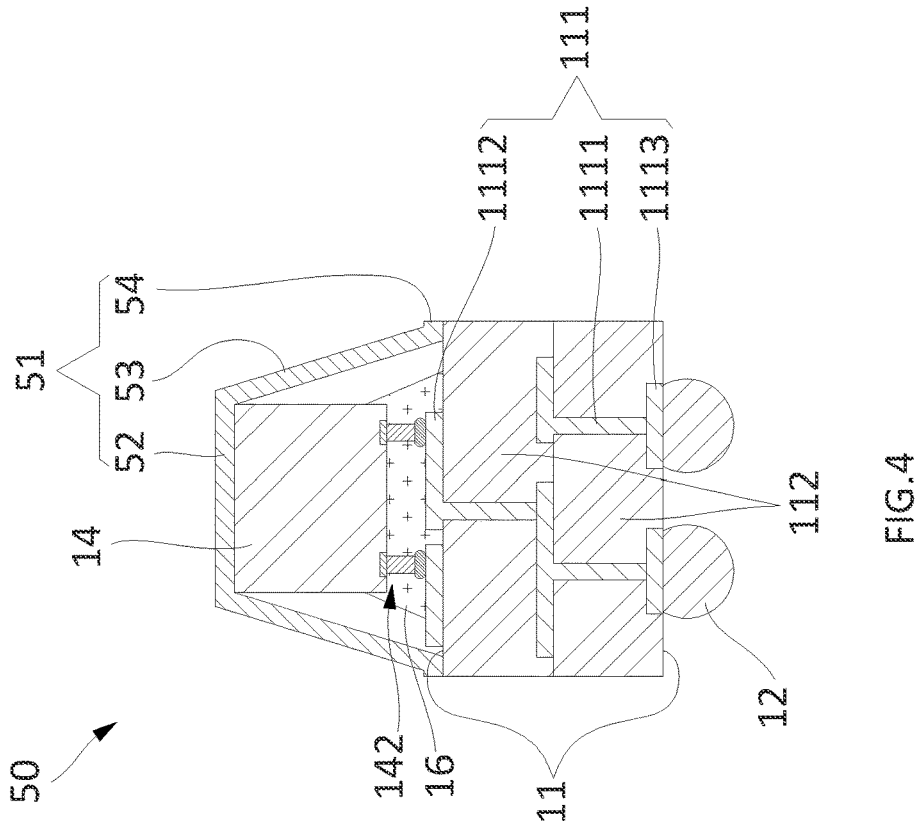
FIG. 4 shows a cross-sectional view of an example semiconductor device.

FIG. 4 shows a cross-sectional view of an example semiconductor device 50. Semiconductor device 50 can be similar to semiconductor device 10 shown in FIG. 1 but comprises metal lid 51 instead of unit body 15.

Metal lid 51 can comprise lid top 52 adhered onto a top side of electronic component 14, lid sidewall 53 extending from top lid 52 to unit substrate 11, and lid bottom 54 attached to unit substrate 11. In some examples, lid top 52 of metal lid 51 can be adhered to electronic component 14 using a thermally conductive adhesive. In some examples, lid bottom 54 of metal lid 51 can be attached to unit substrate 11 using an electrically conductive adhesive. Lid sidewall 53 is shown sloped or slanted, but in some examples can be orthogonal to lid top 52. In some examples, metal lid 51 can be electrically connected to conductive structure 111 for grounding of unit substrate 11. In some examples, a first metal lid 51 can be on a top side of subpanel substrate 21 or unit substrate 11 over a first electronic component 14, and a second metal lid 51 can be on a top side of subpanel substrate 21 or unit substrate 11 over a second electronic component 14. Metal lid 51 can be provided over the electronic components 14 before or after singulation of subpanel substrate 21 into individual unit substrates 11. Metal lid 51 can comprise aluminum, copper or stainless steel. Metal lid 51 can have a thickness in the range from about 1 millimeter (mm) to about 10 mm.

In this way, metal lid 51 can protect electronic component 14 from external mechanical/chemical environments, can rapidly emit heat from electronic component 14 to exterior side of electronic component 14, and can protect electronic component 14 from electromagnetic wave. In some examples, metal lid 51 can prevent an electromagnetic wave generated from electronic component 14 from being emitted to exterior side of electronic component 14.

Figure 5:
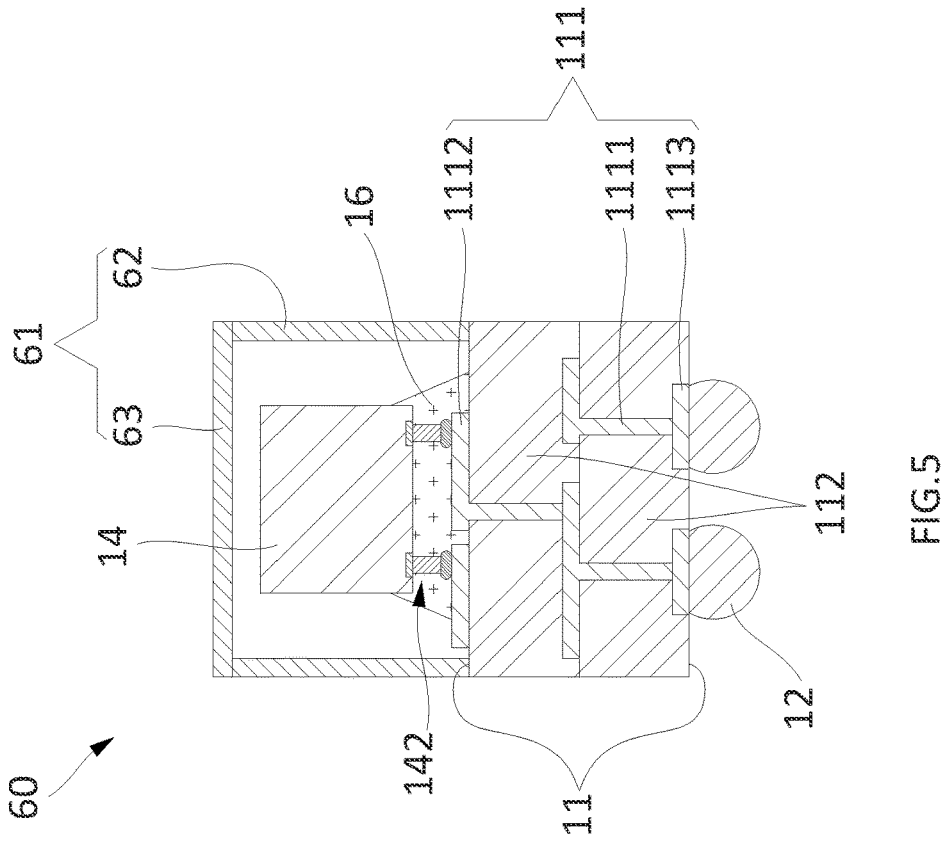
FIG. 5 shows a cross-sectional view of an example semiconductor device.

FIG. 5 shows a cross-sectional view of an example semiconductor device 60. Semiconductor device 60 can be similar to semiconductor device 10 shown in FIG. 1 but comprises cover 61 instead of unit body 15.

Cover 61 can comprise cover side 62 and cover top 63. Cover side 62 can be adhered to unit substrate 11 and can be parallel with side portions of electronic component 14. In some examples, cover top 63 can be adhered to a top end of side cover 62 and can be parallel with a top side of electronic component 14. In some examples, cover top 63 can be adhered to top side of electronic component 14 using thermally conductive adhesive. In some examples, cover top 63 can be adhered to cover side 62 using electrically conductive adhesive. Cover side 62 can be adhered to unit substrate 11 using electrically conductive adhesive. In some examples, cover side 62 can be electrically connected to conductive structure 111 for grounding of unit substrate 11. In some examples, a first cover 61 can be on a top side of subpanel substrate 21 or unit substrate 11 over a first electronic component 14, and a second cover 61 can be on a top side of subpanel substrate 21 or unit substrate 11 over a second electronic component 14. Cover 61 can be provided over the electronic components 14 before or after singulation of subpanel substrate 21 into individual unit substrates 11. Cover side 62 or cover top 63 can comprise a metallic material such as aluminum, copper, or stainless steel, or a dielectric material such as a thermoplastic or a laminate cavity substrate. In some examples, cover side 62 and cover top 63 can have a thickness in the range from about 1 mm to about 10 mm.

Figure 6:
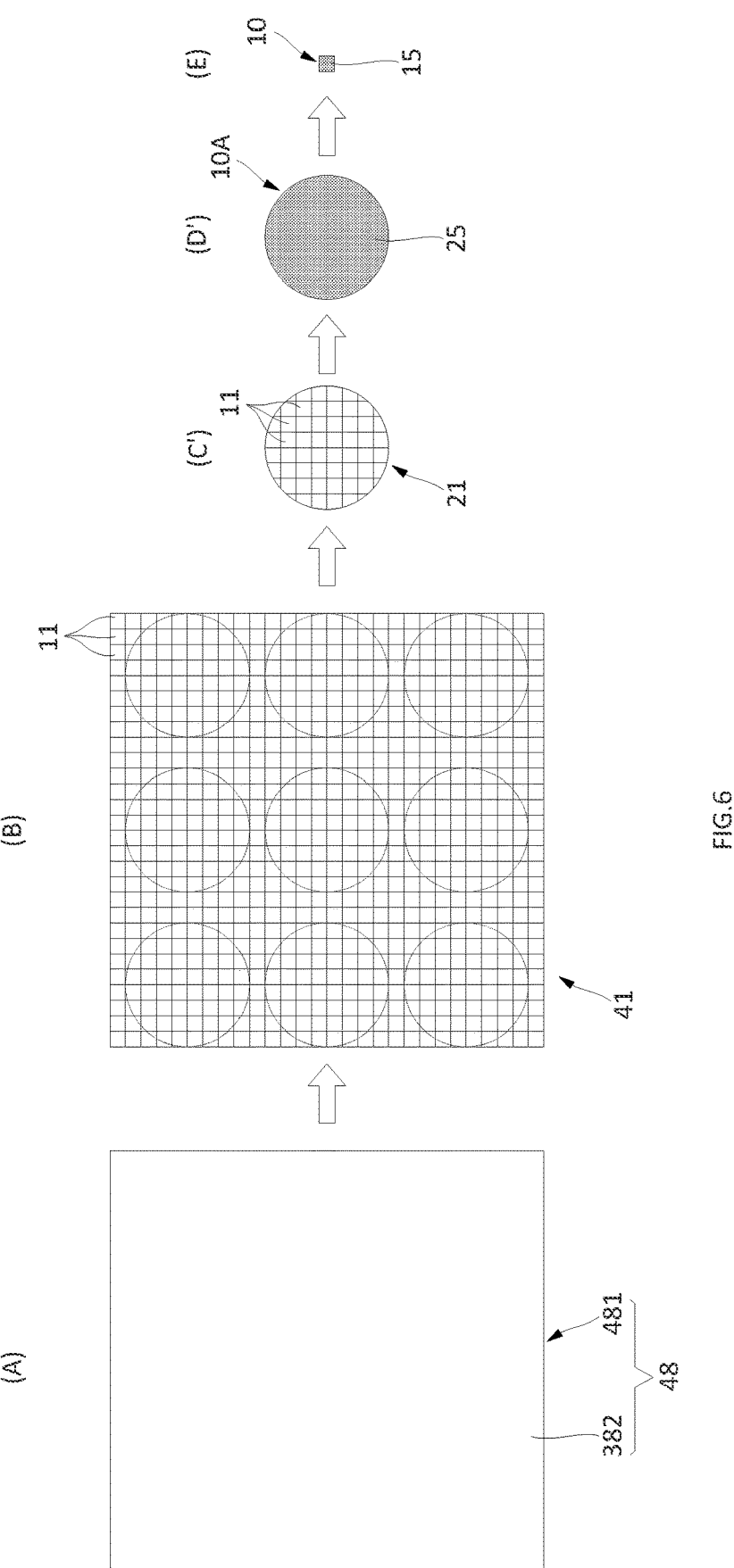
FIG. 6 shows a schematic view of an example method for manufacturing an example semiconductor device.

FIG. 6 shows a schematic view of an example method for manufacturing an example semiconductor device 10. In the example shown in FIG. 6, the example method for manufacturing semiconductor device 10 can be similar to the manufacturing method shown in FIG. 2, except for steps of (C') forming or providing subpanel substrate 21 so as to have a circular or wafer shape and (D') forming or providing subpanel device array 10A so as to have a circular or wafer shape.

In some examples, multiple circular subpanel substrates 21 are singulated or separated from rectangular panel substrate 41. Circular dotted lines indicated on rectangular panel substrate 41 represent cutting lines for circular subpanel substrates 21 to be separated from panel substrate 41. In some examples, a subpanel substrate 21 can comprise a wafer form-factor, and a panel substrate 41 can comprise a rectangular area having a side dimension of at least 400 mm.

In some examples, circular subpanel substrates 21 can comprise, for example, about 32 discrete unit substrates 11. In some examples, panel substrate 41 can comprise a 3×3 array of nine circular subpanel substrates 21. Although a number of unit substrates 11 of one single subpanel substrate 21 or a number of subpanel substrates 21 of one single panel substrate 41 is provided only by way of example, this is not a limitation of the present disclosure. In some examples, the number of unit substrates 11 or the number of subpanel substrates 21 can be greater than or less than those stated in the present disclosure. In this way, since subpanel substrate 21 has a substantially circular or wafer shape, existing semiconductor assembling equipment can be used without being modified or replaced.

Figure 7:
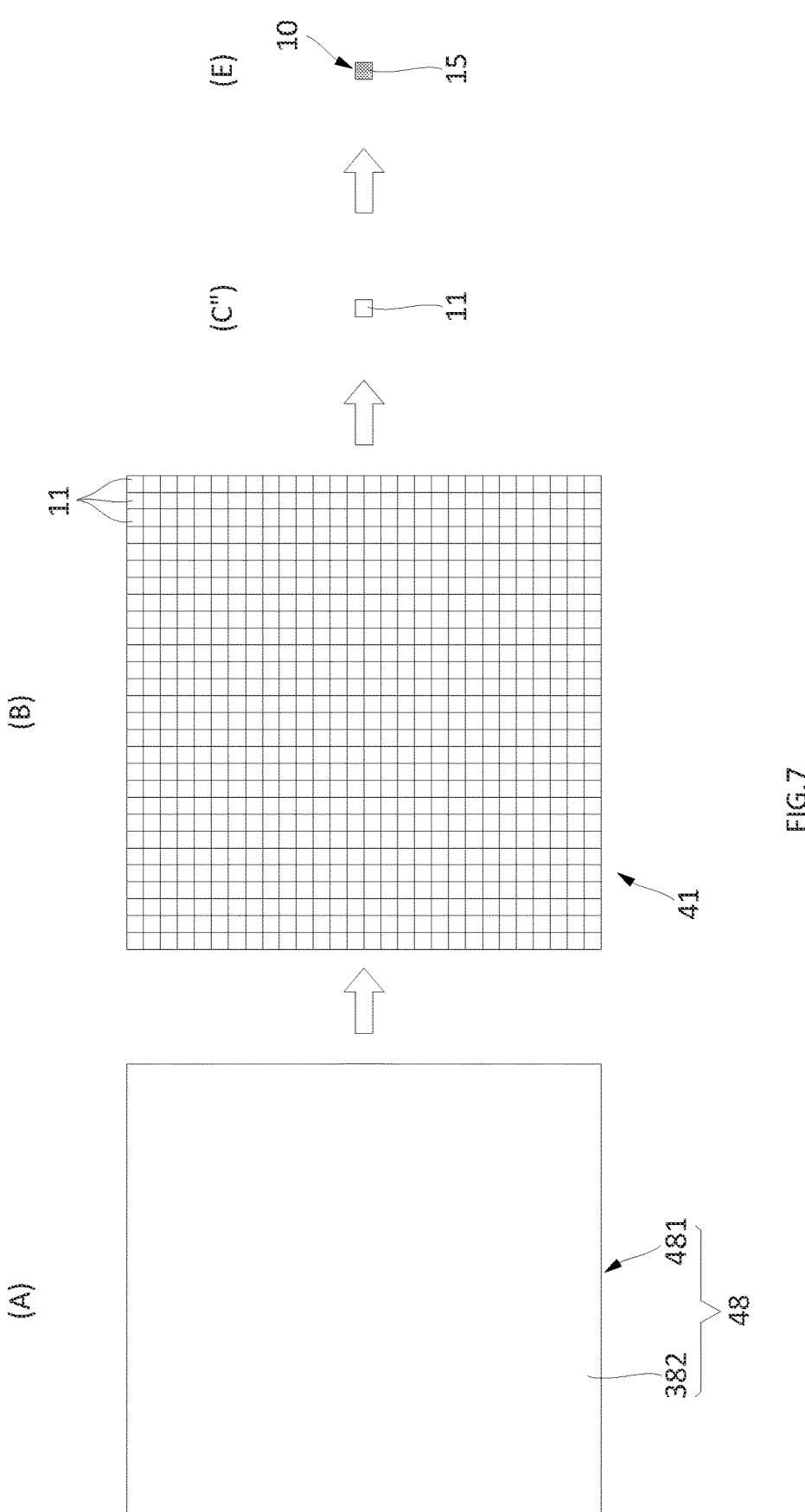
FIG. 7 shows a schematic view of an example method for manufacturing an example semiconductor device.

FIG. 7 shows a schematic view of an example method for manufacturing an example semiconductor device 10. In the example shown in FIG. 7, the example method for manufacturing semiconductor device 10 can be similar to the manufacturing method shown in FIGS. 2-3, except for step of singulating subpanel substrates 21 from panel substrate 41.

In some examples individual unit substrates 11 can be singulated from panel substrate 41, and a semiconductor assembling process can be performed with such unit substrates 11 individually instead of as part of a subpanel substrate 21. Such an approach can be suitable for larger unit substrates 11, such as Flip-Chip Ball- Grid-Array (FCBGA) substrates, having an area greater than 144 square millimeters (mm²), or having dimensions greater than an array of 12 mm×12 mm. In some examples, such an assembly process can be similar to one or more of assembly processes described here, such as the process described in FIGS. 3D-3G, but individually instead of as part of a subpanel substrate 21. In some examples, unit substrates 11 can be tested to determine whether they are good or bad. Unit substrates 11 that have passed testing can be used for semiconductor device assembling process. Good unit substrates 11, excluding unit substrates 11 determined as bad products, can be subjected to assembly process to avoid material squandering.

Figure 8:
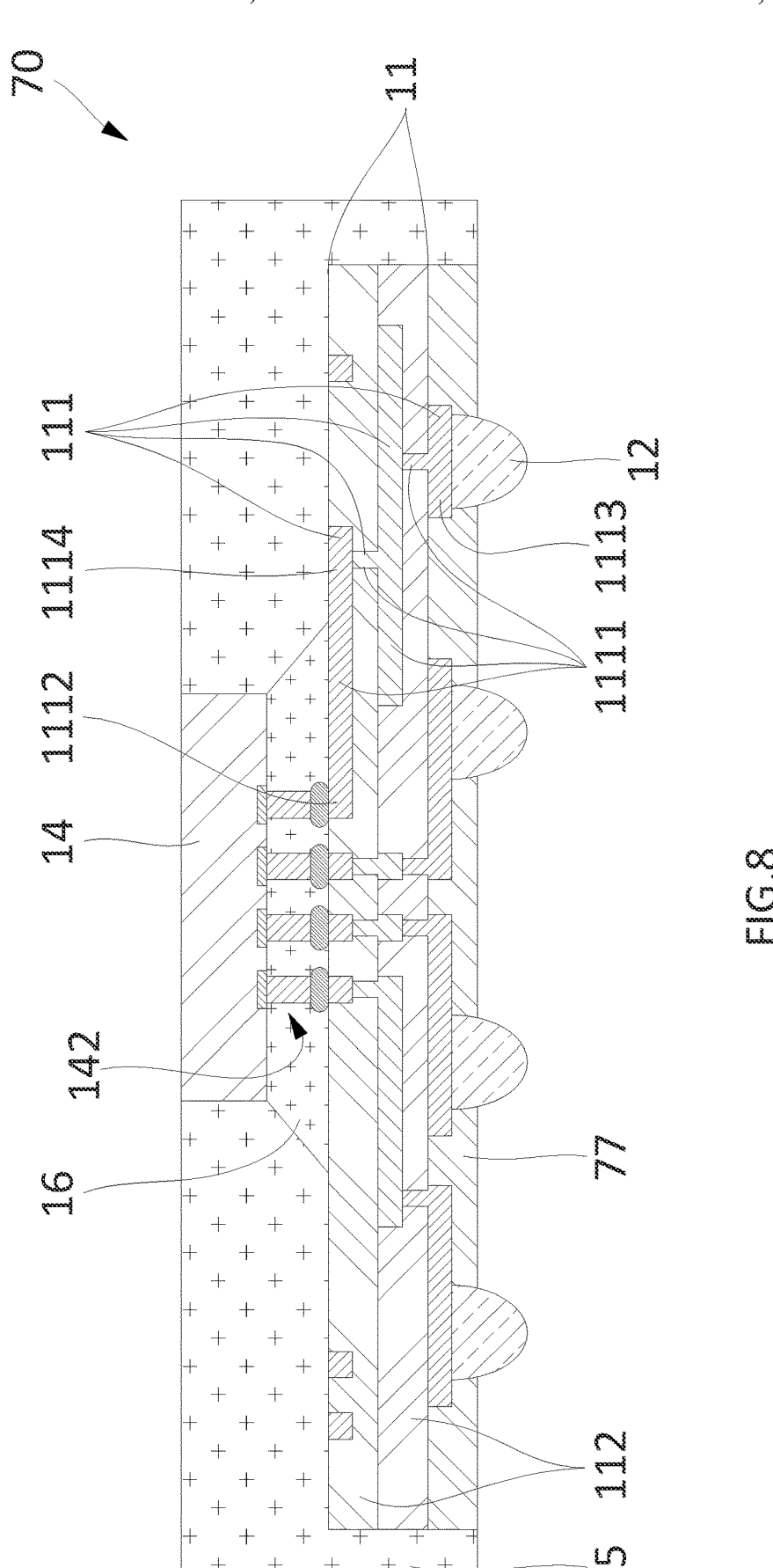
FIG. 8 shows a cross-sectional view of an example semiconductor device.

FIG. 8 shows a cross-sectional view of an example semiconductor device 70. In some examples, semiconductor device 70 can be similar to semiconductor device 10 shown in FIG. 1, but unit body 75 covers lateral sides of unit substrate 11 and bottom encapsulant 77 covers a bottom surface of unit substrate 11. In some examples, unit body 75 can cover not only the lateral sides of unit substrate 11 but also lateral sides of bottom encapsulant 77. In some examples bottom encapsulant 77 can cover not only the bottom surface of unit substrate 11 but also lateral sides of external interconnects 12. In some examples, with unit body 75 covering the lateral sides of unit substrate 11 and the lateral sides of bottom encapsulant 77, and bottom encapsulant 77 covering the bottom surface of unit substrate 11, warpage of semiconductor device 70 can be suppressed.

Figures 9A, 9B, 9C:
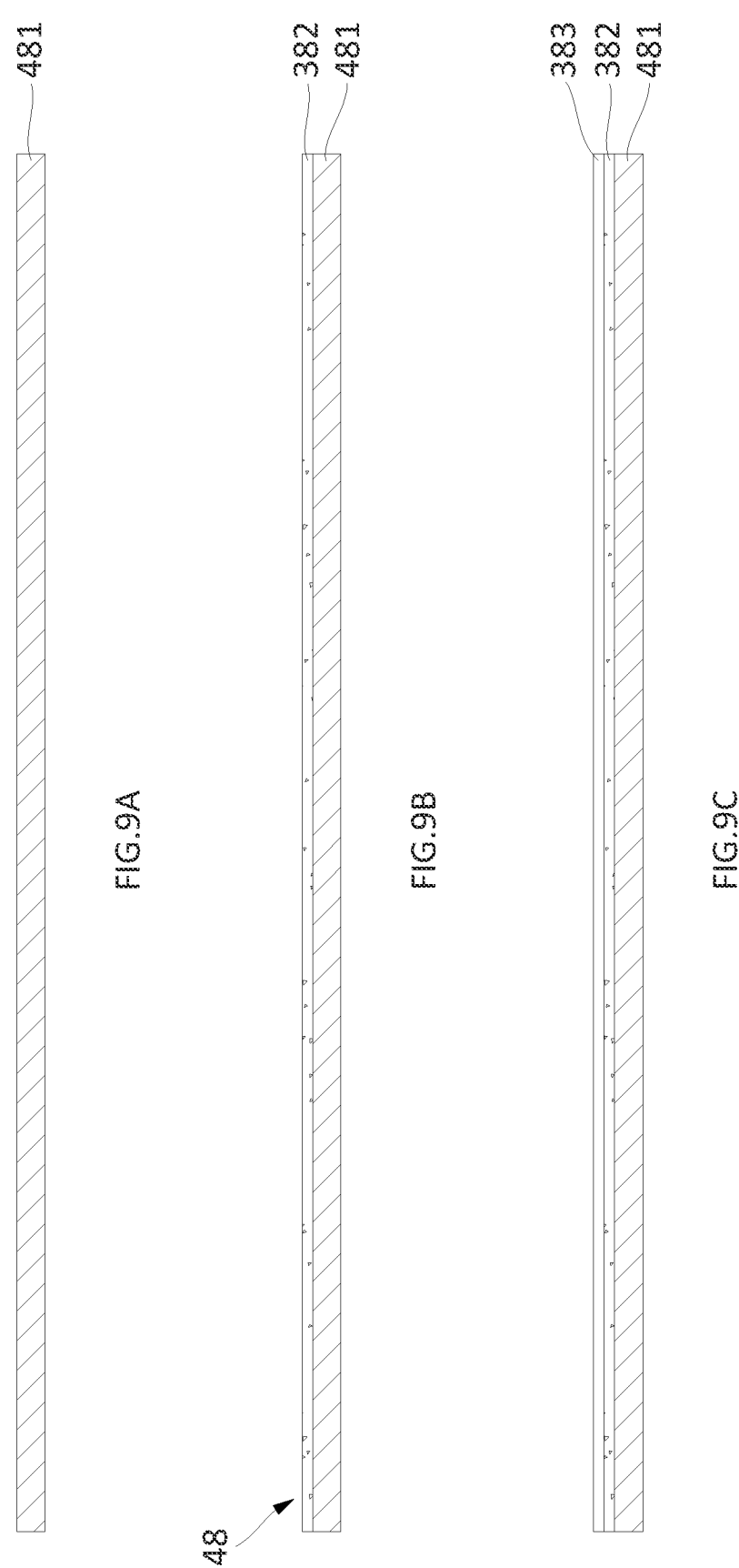
FIGS. 9A to 9S show cross-sectional views of an example method for manufacturing an example semiconductor device.
Figures 9D, 9E, 9F:
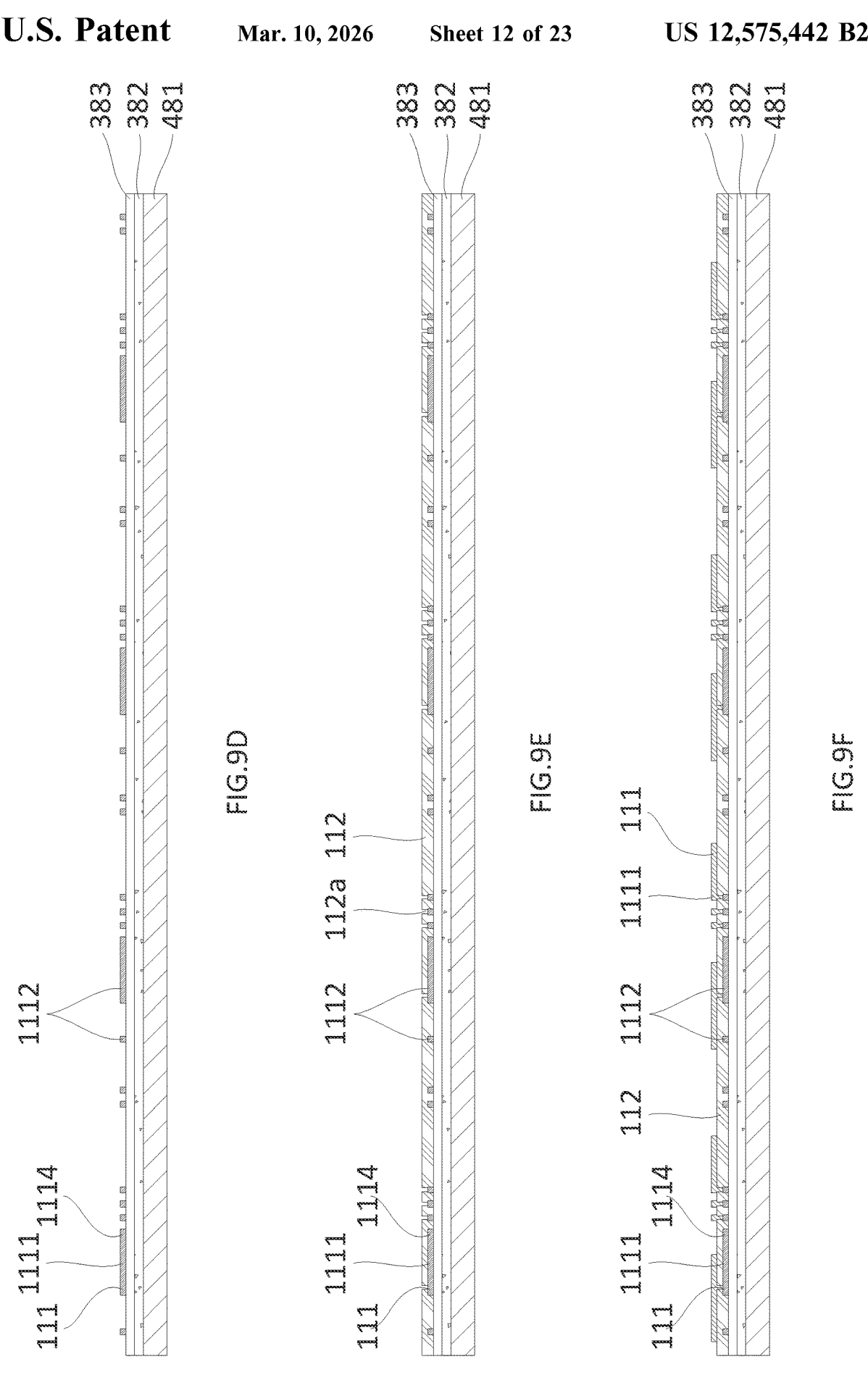
Figures 9G, 9H:
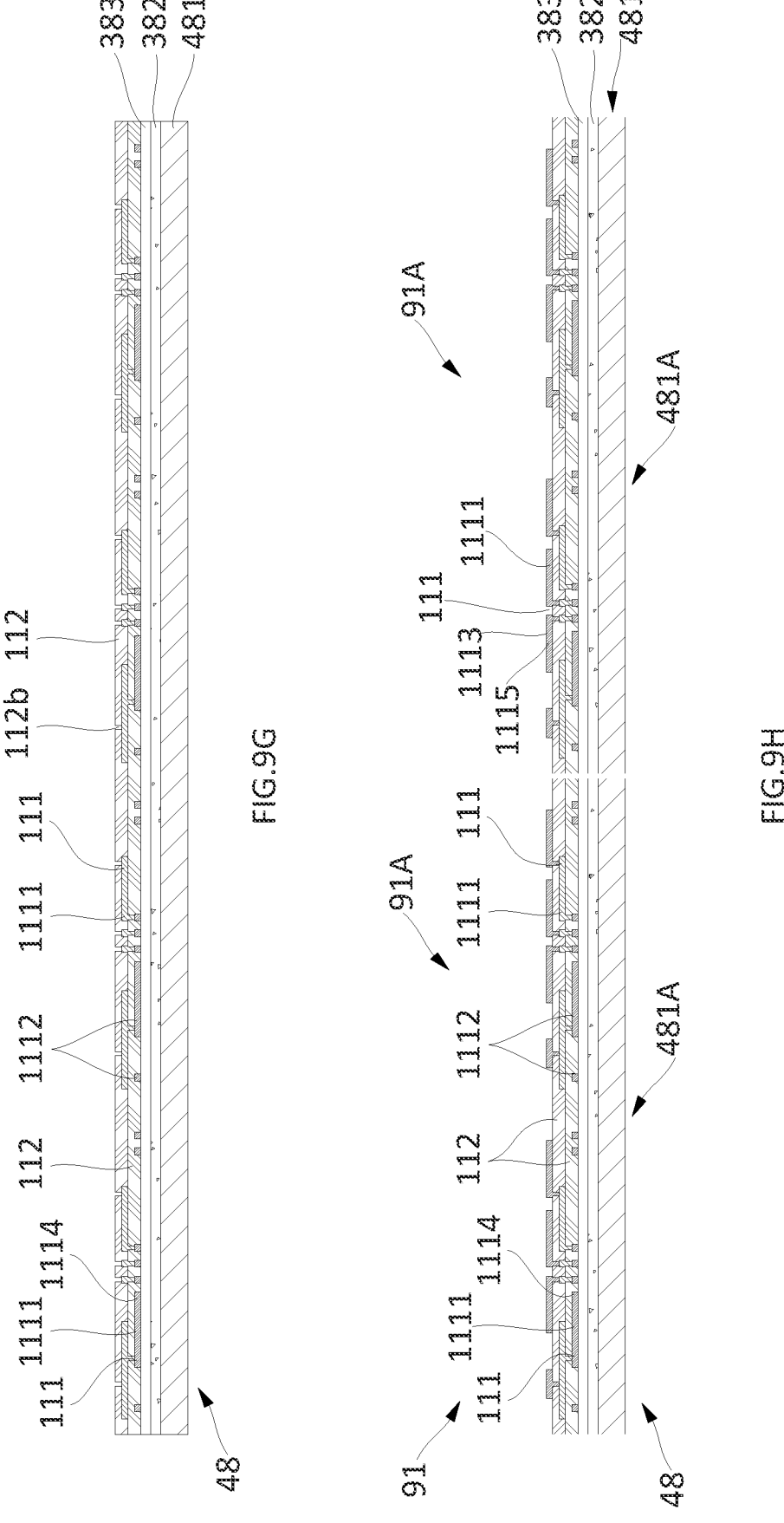
Figure 9I:
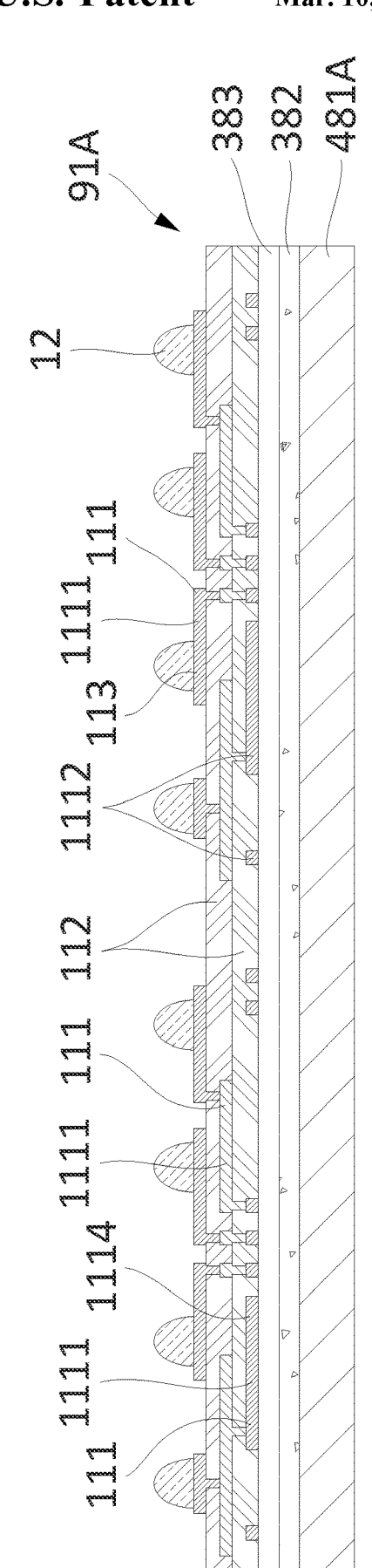
Figure 9J:
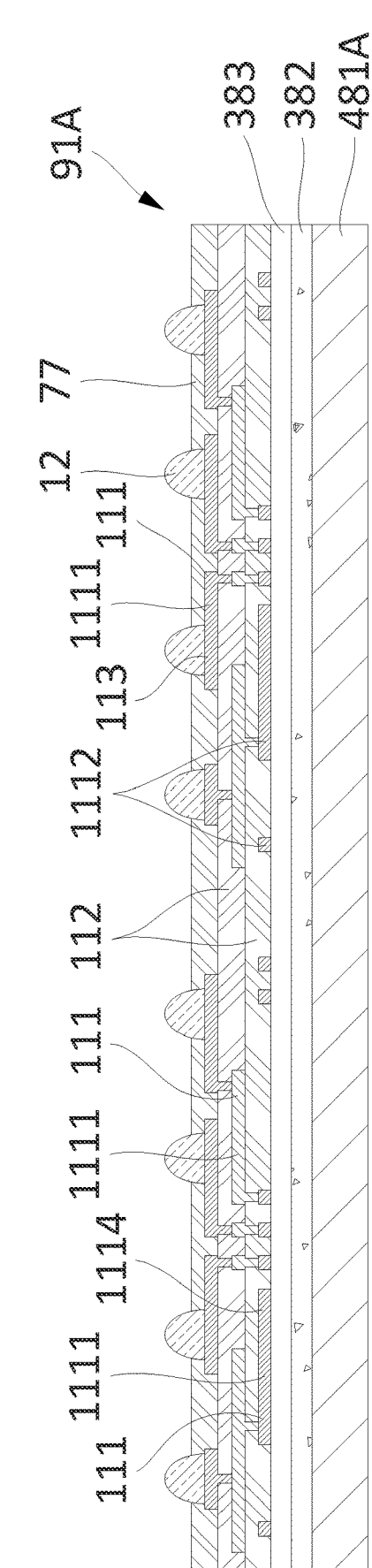
Figures 9K, 9L:
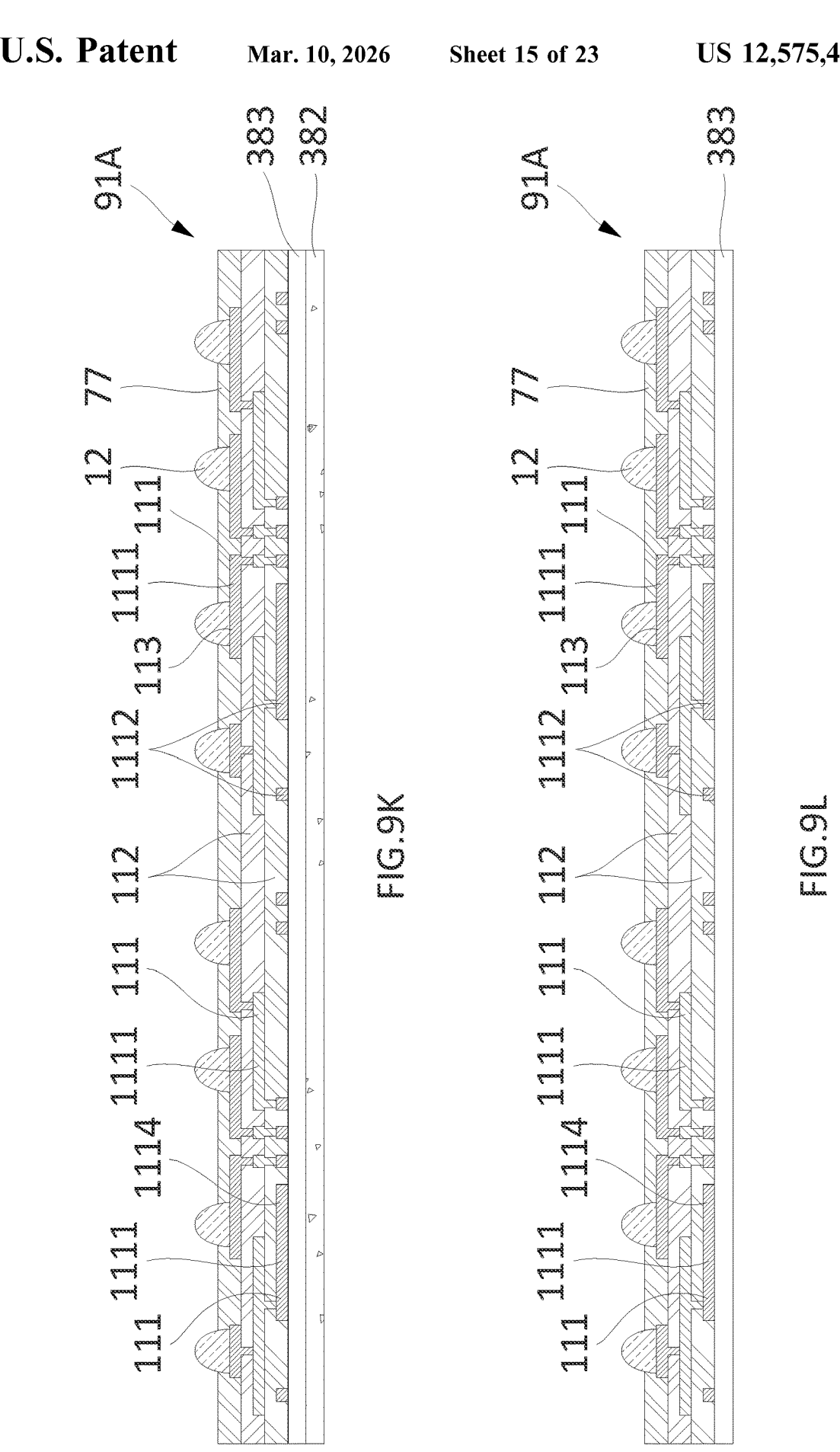
Figures 9M, 9N:
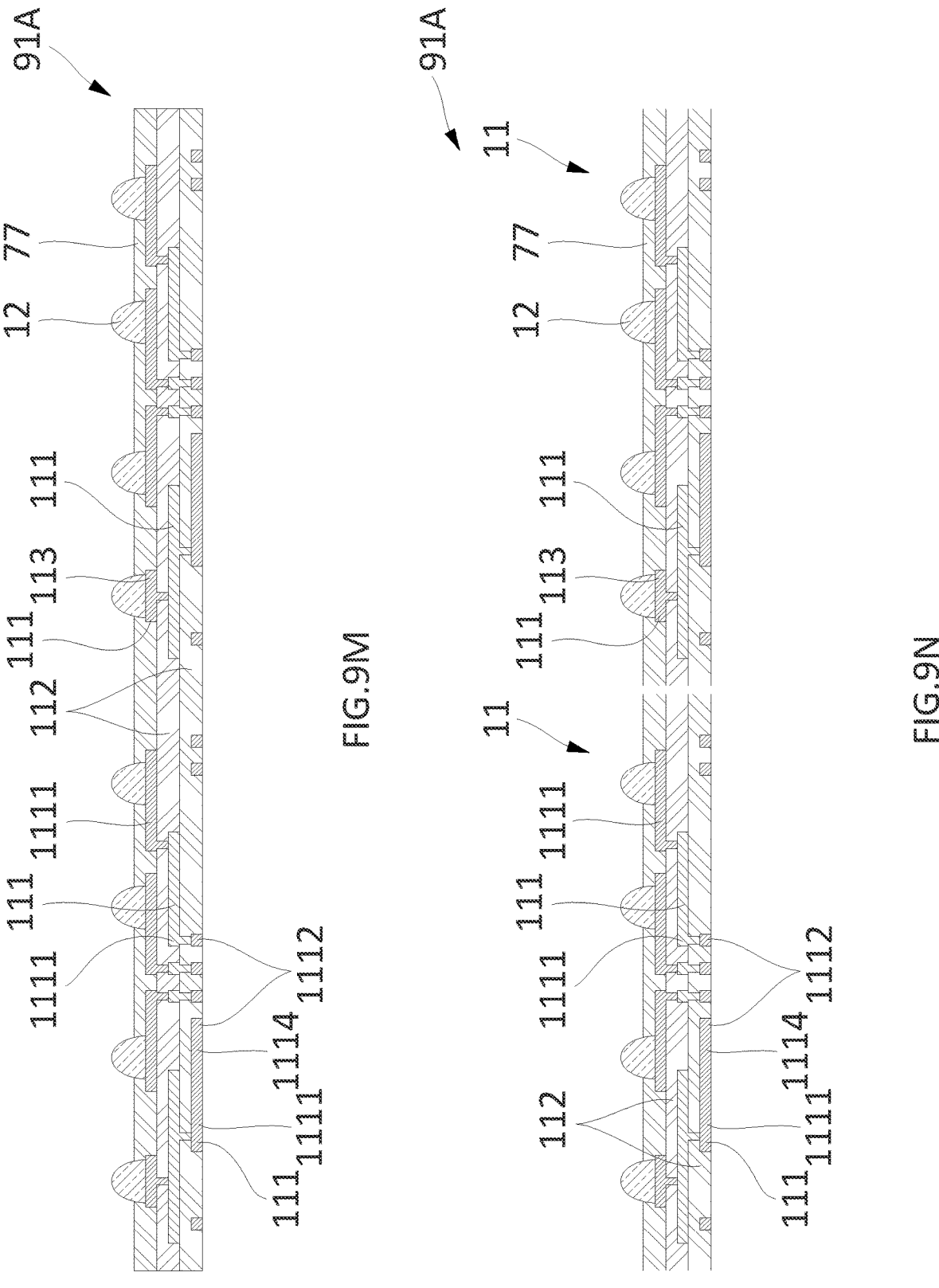
Figures 9O, 9P:
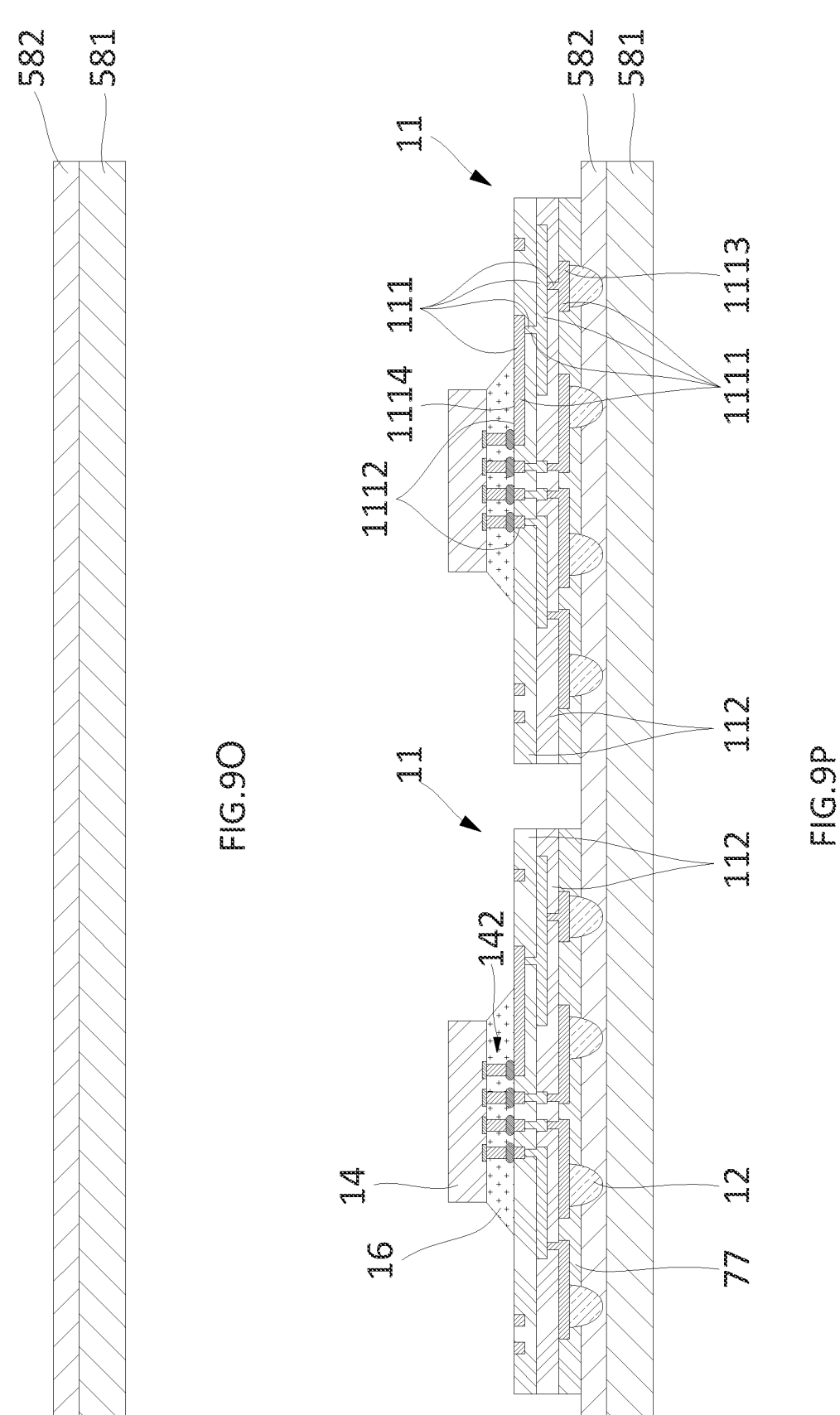
Figure 9S:
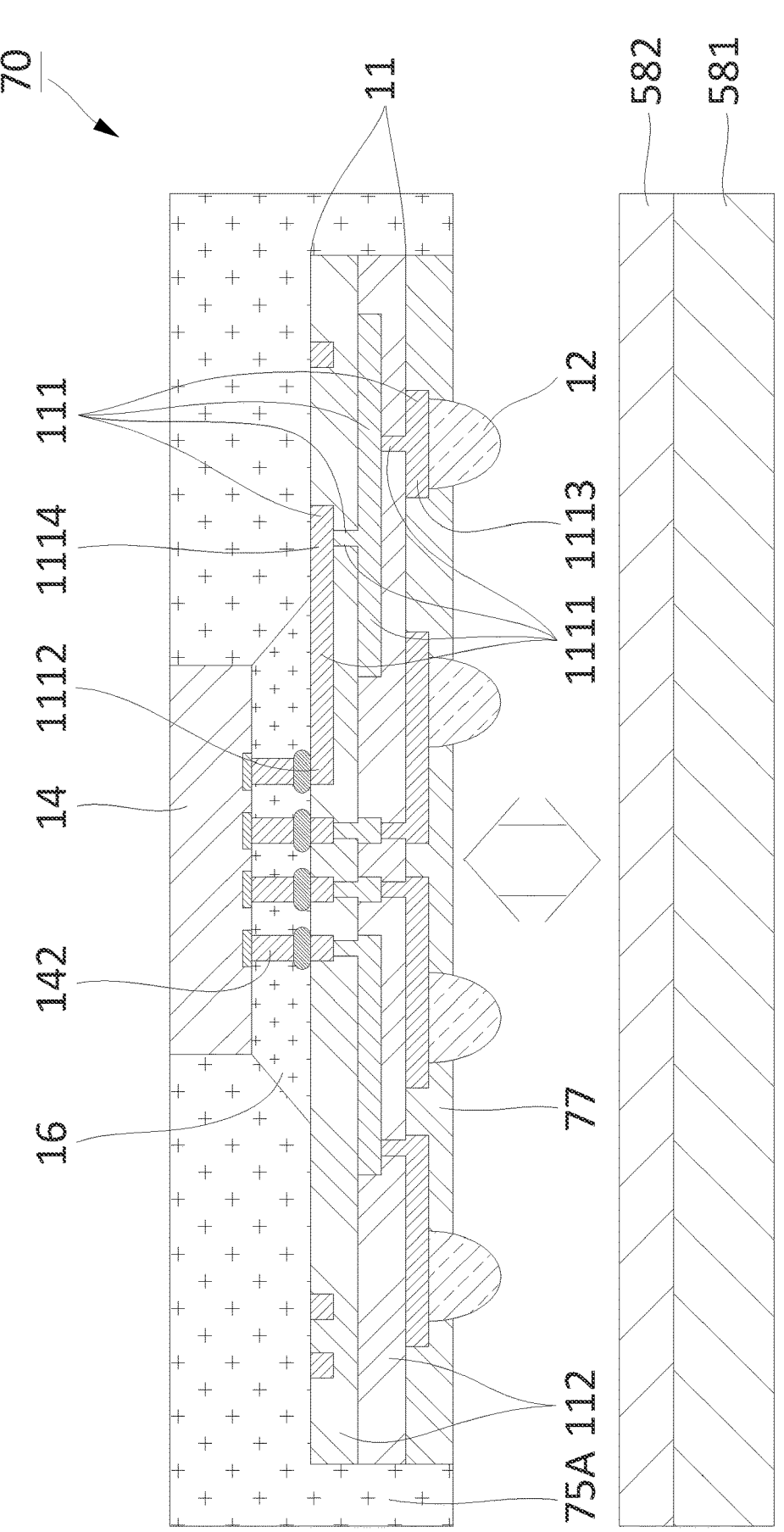

FIG. 9A to FIG. 9S show cross-sectional views of an example method for manufacturing example semiconductor device 70. The example manufacturing method, features, structures, or elements for semiconductor device 70 shown in FIGS. 9A to 9S can be similar to those described with respect to example semiconductor device 10 shown in FIGS. 3A to 3G such that the following description will be simplified.

FIG. 9A shows a cross-sectional view of semiconductor device 70 at an early stage of manufacture. In the example shown in FIG. 9A, panel base 481 can be provided. In some examples, panel base 481 can have a substantially planar top surface and a substantially planar bottom surface opposite to the top surface. Panel base 481 can comprise or can be referred to as glass, silicon, ceramic, or a metal.

FIG. 9B shows a cross-sectional view of semiconductor device 70 at a later stage of manufacture. In the example shown in FIG. 9B, temporary adhesive 382 can be provided on panel base 481. In some examples, temporary adhesive 382 can comprise or can be referred to as a thermocurable adhesive resin or a thermoplastic resin. Here, panel base 481 and temporary adhesive 382 can be collectively referred to as panel 48, as described above (see for example FIG. 3A).

FIG. 9C shows a cross-sectional view of semiconductor device 70 at a later stage of manufacture. In the example shown in FIG. 9C, seed layer 383 can be provided on temporary adhesive 382. In some examples, seed layer 383 can comprise titanium (Ti), titanium tungsten (TiW), copper (Cu), titanium/copper (Ti/Cu), titanium tungsten/copper (TiW/Cu), or nickel vanadium (NiV).

FIG. 9D shows a cross-sectional view of semiconductor device 70 at a later stage of manufacture. In the example shown in FIG. 9D, a first tier of conductive structure 111 can be formed or provided on seed layer 383. In some examples, the first tier of conductive structure 111 can be provided by steps of photolithographic mask patterning and electroplating. Conductive structure 111 can comprise one or more conductive paths 1111 having traces or vias. In some examples, one or more traces of conductive path 1111 can comprise or be referred to as top embedded trace 1114. Conductive structure 111 can comprise substrate top terminals 1112, which can be part or a portion of conductive paths 1111 in some examples.

FIG. 9E shows a cross-sectional view of semiconductor device 70 at a later stage of manufacture. In the example shown in FIG. 9E, a first tier or dielectric structure 112 can be formed or provided on the first tier of conductive structure 111 and on panel 48. In some examples, dielectric structure 112 can be coated on the entire surface of conductive structure 111 and seed layer 383, and cured, photoresist can be coated on dielectric structure 112, and photolithography can be carried out to pattern the photoresist. A region of dielectric structure 112 can be etched using the photoresist as a mask to expose part of the first tier of conductive structure 111 through openings 112a.

FIG. 9F shows a cross-sectional view of semiconductor device 70 at a later stage of manufacture. In the example shown in FIG. 9F, a second tier of conductive structure 111 can be formed or provided on the first tier of dielectric structure 112 in a similar manner as described above. The second tier of conductive structure 111 can be connected to the pre-existing first tier of conductive structure 111 through openings 112a of the first tier of dielectric structure 112. The second tier of conductive structure 111 can comprise respective conductive paths 1111.

FIG. 9G shows a cross-sectional view of semiconductor device 70 at a later stage of manufacture. In the example shown in FIG. 9G, a second tier of dielectric structure 112 can be provided on the second tier of conductive structure 111 in a similar manner as the first tier of dielectric structure 112. A region of the second tier of dielectric structure 112 can be etched to expose part of the second tier of conductive structure 111 through openings 112b.

FIG. 9H shows a cross-sectional view of semiconductor device 70 at a later stage of manufacture. In the example shown in FIG. 9H, a third tier of conductive structure 111 can be formed or provided on the second tier of dielectric structure 112 in a similar manner as described above. The third tier of conductive structure 111 can be connected to the pre-existing second tier of conductive structure 111 through openings 112b of the second tier of dielectric structure 112. The third tier of conductive structure 111 can protrude over the second tier of dielectric structure 112 or can comprise respective conductive paths 1111 having traces or vias. In some examples, one or more of such traces can comprise or be referred to as a protruded trace 1115. In contrast to the first tier of conductive structure 111 that is provided under and is embedded in dielectric structure 112, the third tier of conductive structure 111 is provided on and protrudes over dielectric structure 112. Conductive structure 111 can comprise substrate bottom terminals 1113, which can be part or a portion of conductive paths 1111 in some examples.

The steps described in FIGS. 9A-9H can yield panel substrate 91 formed or provided on panel 48. In some examples, aspects of panel substrate 91 can be similar to corresponding aspects of other panel substrates described in this disclosure. Singulation can be carried out to divide panel substrate 91 and panel 48 into different subpanel substrates 91A and subpanel bases 481A.

FIG. 9I shows a cross-sectional view of semiconductor device 70 at a later stage of manufacture. In the example shown in FIG. 9I, subpanel base 481A and subpanel substrate 91A are shown singulated from previous stage wherein subpanel substrate 91A is singulated from panel substrate 41 or 41A. Subpanel substrate 91A can comprise conductive structure 111 and dielectric structure 112. In some examples, subpanel base 481A and subpanel substrate 91A can be circular or strip-shaped. External interconnects 12 can be attached to subpanel substrate 91A. In some examples, external interconnects 12 can be connected to substrate bottom terminals 1113 provided on subpanel substrate 91A. In some examples, prior to the singulation process, external interconnects 12 can be attached to substrate bottom terminals 1113.

In the example method for manufacturing example semiconductor device 10 shown in FIGS. 3A-3G, electronic component 14 can first be attached to the substrate, and external interconnects 12 can be later attached. In the example method for manufacturing example semiconductor device 70 shown in FIGS. 9A to 9S, however, external interconnects 12 can be first attached to the substrate, and electronic component 14 can be later attached.

FIG. 9J shows a cross-sectional view of semiconductor device 70 at a later stage of manufacture. In the example shown in FIG. 9J, bottom encapsulant 77 can be provided on subpanel substrate 91A. In some examples, bottom encapsulant 77 can cover dielectric structure 112, conductive path 1111, or substrate bottom terminal 1113 located on subpanel substrate 91A.

In some examples, bottom encapsulant 77 can also cover lateral sides of external interconnects 12. In some examples, some regions of external interconnects 12 can be exposed or protruded through bottom encapsulant 77. Bottom encapsulant 77 can comprise or can be referred to as a mold compound resin, a sealant or an organic body. In some examples, bottom encapsulant 77 can be formed or provided by a compression molding process, a transfer molding process, a liquid phase encapsulant molding process, a vacuum lamination process, a paste printing process, or a film assisted molding process. A thickness of bottom encapsulant 77 can be less than or equal to the thickness of external interconnects 12. Bottom encapsulant 77 can have a thickness in the range from about 1 μm to about 400 μm. Bottom encapsulant 77 can protect conductive structure 111 and external interconnects 12 from external elements or environmental exposure, can provide structural reinforcement for the connection between external interconnects 12 and substrate bottom terminal 1113, or can suppress substrate warpage.

FIG. 9K shows a cross-sectional view of semiconductor device 70 at a later stage of manufacture. In the example shown in FIG. 9K, subpanel base 481A can be removed. In some examples, temporary adhesive 382 can be exposed. In some examples, when subpanel base 481A is removed, temporary adhesive 382 can also be removed. In some examples, subpanel base 481A can be removed before providing the electronic components 14 on subpanel substrate 91A or on individual unit substrates 11.

FIG. 9L shows a cross-sectional view of semiconductor device 70 at a later stage of manufacture. In the example shown in FIG. 9L, temporary adhesive 382 can be removed from subpanel substrate 91A. In some examples, seed layer 383 can be exposed.

FIG. 9M shows a cross-sectional view of semiconductor device 70 at a later stage of manufacture. In the example shown in FIG. 9M, seed layer 383 can be removed from subpanel substrate 91A. The first tier of conductive structure 111, top terminal 1112, top embedded trace 1114, or the first tier of dielectric structure 112 of subpanel substrate 91A can be exposed. In some examples, exposed sides of conductive structure 111, substrate top terminal 1112, top embedded trace 1114, and dielectric structure 112 can be coplanar with one another. The coplanar sides can provide excellent flowability of underfill during a subsequent stage or excellent flowability of an encapsulant or subpanel body during a subsequent stage.

FIG. 9N shows a cross-sectional view of semiconductor device 70 at a later stage of manufacture. In the example shown in FIG. 9N, subpanel substrate 91A can be subjected to singulation, such as by diamond wheel or laser beam, to separate unit substrates 11 having respective external interconnects 12. In some examples, the singulation can make dielectric structure 112 of unit substrate 11 and lateral sides of bottom encapsulant 77 coplanar with each other.

FIG. 9O shows a cross-sectional view of a later stage of manufacture for semiconductor device 70. In the example shown in FIG. 9O, support carrier 581 and elastic film 582 can be provided. Elastic film 582 can comprise or can be referred to as a photo-sensitive polyimide (PSPI) tape film, a pressure-sensitive adhesive (PSA) tape film, or a double sided adhesive. A thickness of elastic film 582 can be equal to or greater than external interconnects 12 protruded from bottom encapsulant 77. Support carrier 581 can comprise or can be referred to as a metal substrate, a plastic substrate, a glass substrate, or a ceramic substrate. Support carrier 581 can support multiple unit substrates 11 in a later stage to be described below.

FIG. 9P shows a cross-sectional view of semiconductor device 70 at a later stage of manufacture. In the example shown in FIG. 9P, pretested known-good unit substrates 11 can be arranged on elastic film 582 located on support carrier 581, and electronic components 14 can be electrically connected onto arranged unit substrates 11. In some examples, external interconnects 12 of unit substrates 11 are inserted into elastic film 582, and bottom encapsulant 77 of unit substrates 11 can be brought into close contact with elastic film 582. Device interconnects 142 of electronic component 14 can be connected to substrate top terminal 1112 of each of unit substrates 11 through bonding tips or materials, such as solder.

In some examples, underfill 16 can be positioned between electronic component 14 and unit substrate 11. In some examples, underfill may not be positioned between electronic component 14 and unit substrate 11. In some examples, large arrays of unit substrates 11 can be arranged on support carrier 581, and gaps can exist between each of unit substrates 11.

FIG. 9Q shows a cross-sectional view of semiconductor device 70 at a later stage of manufacture. In the example shown in FIG. 9Q, subpanel body 75 can cover unit substrates 11, electronic component 14, or underfill 16. In some examples, subpanel body 75 can be similar to subpanel body 25 previously described. In some examples, subpanel body 75 can cover lateral sides of unit substrates 11, or lateral sides of bottom encapsulant 77. Subpanel body 75 can fill the gaps between each of unit substrates 11. In some examples, a top side of subpanel body 75 and a top side of electronic component 14 can be substantially coplanar. In some examples, the top side of electronic component 14 can be exposed through the top side of subpanel body 75. In some examples, subpanel body 75 can be provided on subpanel substrate 91A before singulation or partial singulation, or on unit substrates 11 after singulation or partial singulation. Subpanel body 75 can contact a lateral side of a first electronic component 14 and a lateral side of a second electronic component 14. In some examples, subpanel body 75 can contact a side of unit substrates 11, and can contact a lateral side of bottom encapsulant 77.

FIG. 9R shows a cross-sectional view of semiconductor device 70 at a later stage of manufacture. In the example shown in FIG. 9R, singulation can be performed through subpanel body 75 along the gaps between each of unit substrates 11, defining unit bodies 75A. In some examples, unit bodies 75A can be similar to unit bodies 15 previously described. After the singulation, unit bodies 75A can remain covering lateral sides of unit substrates 11 or lateral sides of bottom encapsulant 77.

FIG. 9S shows a cross-sectional view of semiconductor device 70 at a later stage of manufacture. In the example shown in FIG. 9S, elastic film 582 and support carrier 581 can be removed from semiconductor device 70. Accordingly, external interconnects 12 provided on unit substrates 11 can be exposed to complete independent semiconductor device 70.

Figure 10:
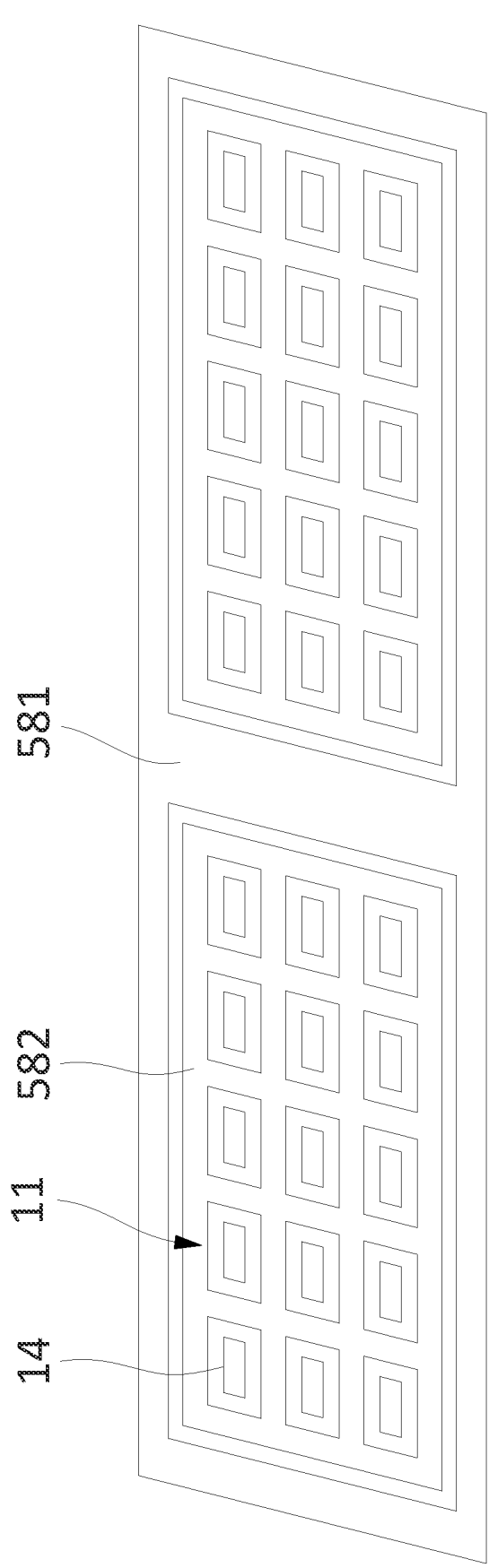
FIG. 10 shows a schematic view of an example method for manufacturing an example semiconductor device.

FIG. 10 shows a perspective view of the example method for manufacturing semiconductor device 70 and can correspond to the views shown in FIGS. 9P-9Q discussed above. In the example shown in FIG. 10, one or more elastic films 582 can be arranged on one single support carrier 581, and multiple pre-singulated unit substrates 11 can be arranged on the one or more elastic film 582s. In some examples, multiple pre-singulated unit substrates 11 can be arranged in array form having rows and columns. In some examples, subpanel body 75 can independently cover individual elastic films 582 located on support carrier 581 or can entirely cover all of elastic films 582 located on support carrier 581.

Figures 11A, 11B:
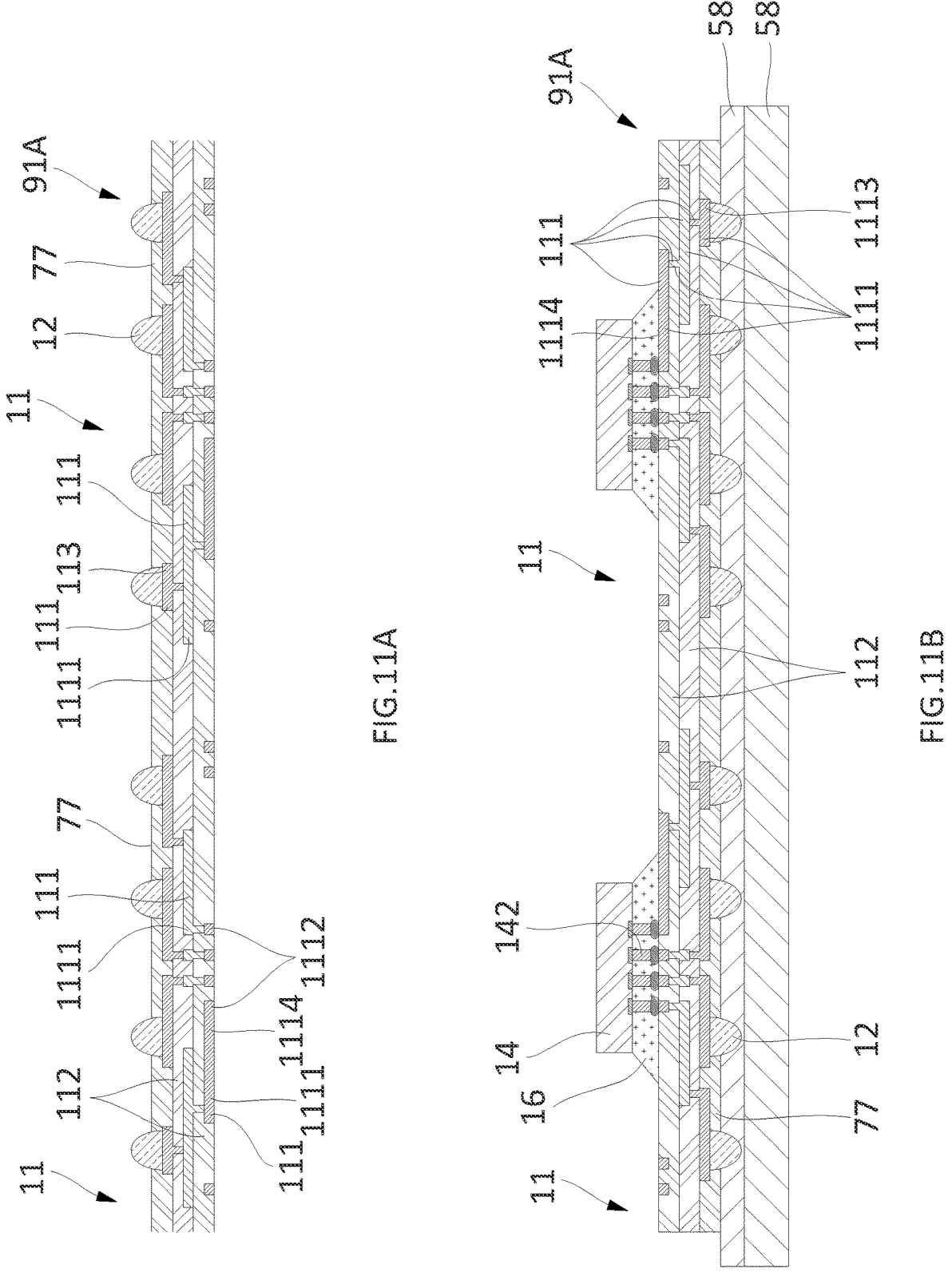
FIGS. 11A to 11C show cross-sectional views of an example method for manufacturing an example semicon-ductor device.

FIGS. 11A to 11O show cross-sectional views of an example method for manufacturing example semiconductor device 70. The example method for manufacturing shown in FIGS. 11A to 11O can be similar to the manufacturing method shown in FIGS. 9A to 9S, but subpanel substrate 91A can be attached onto elastic film 582 located on support carrier 581 and then partially sawed to provide unit substrates 11.

FIG. 11A shows a cross-sectional view of semiconductor device 70 at a later stage of manufacture. In some examples, FIG. 11A can correspond to a next stage after FIG. 9M. In the example shown in FIG. 11A, singulation can be optionally performed on subpanel substrate 91A. Subpanel substrate 91A having a smaller area than initial subpanel substrate 91A can be provided through the singulation. In some examples, subpanel substrate 91A provided through the singulation can also be in a matrix or strip form having rows and columns. In some examples, subpanel substrate 91A can comprise at least two unit substrates 11 still joined.

FIG. 11B shows a cross-sectional view of semiconductor device 70 at a later stage of manufacture. In the example shown in FIG. 11B, subpanel substrate 91A can be attached to elastic film 582 located on support carrier 581, and electronic component 14 can be electrically connected onto subpanel substrate 91A. In some examples, support carrier 581 can be provided on a second side or bottom side of subpanel substrate 91A. In some examples, support carrier 518 can be removed after singulating or after partially singulating subpanel substrate 91A.

Figure 11C:
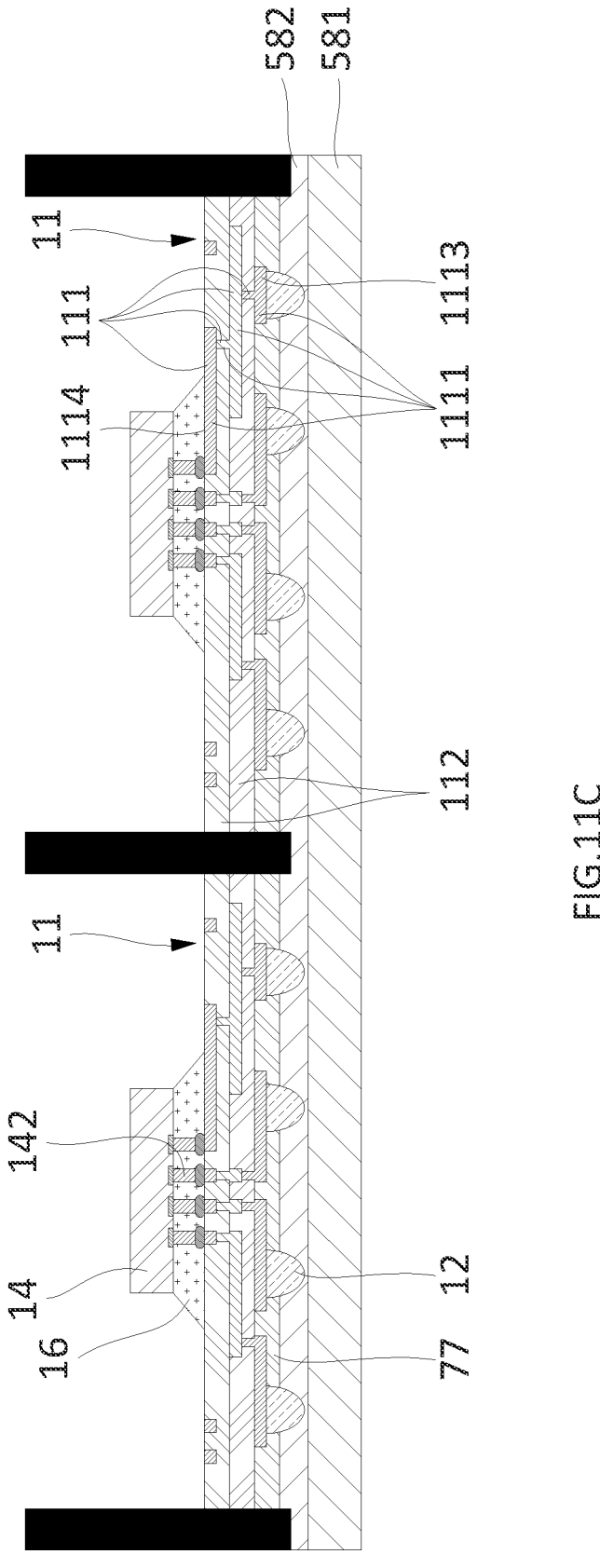

FIG. 11C shows a cross-sectional view of semiconductor device 70 at a later stage of manufacture. In the example shown in FIG. 11C, a partial-singulation process can be performed. In some examples, subpanel substrate 91A can be partially singulated to define multiple separated unit substrates 11 on support carrier 581. The partial singulation can create a gap between each of unit substrates 11. In some examples, the gap between each of unit substrates 11 can be in the range from about 100 μm to about 1000 μm. After completion of the stage shown in FIG. 11C, stages similar to those shown and described above with respect to FIGS. 9Q to 9S can be carried out to manufacture semiconductor device 70. In some examples, subpanel body 75 (FIG. 9Q) can be provided on subpanel substrate 91A before singulation or partial singulation, or on unit substrates 11 after singulation or partial singulation. As shown in FIG. 9Q, subpanel body 75 can contact a lateral side of a first electronic component 14 and a lateral side of a second electronic component 14. The support carrier 581 can then be removed as shown in FIG. 9S.

Figure 12:
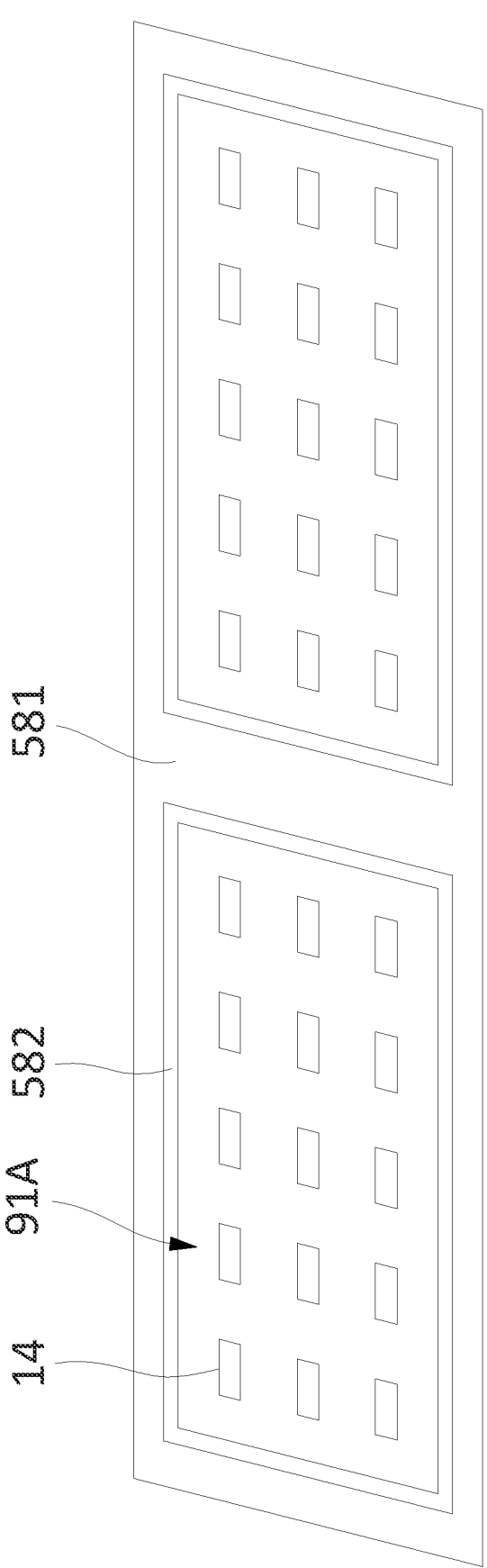
FIG. 12 shows a schematic view of an example method for manufacturing an example semiconductor device.

FIG. 12 shows a perspective view of the example method for manufacturing semiconductor device 70 and can correspond to the view shown in FIG. 11B as described above. In the example shown in FIG. 12, one or more elastic films 582 can be attached onto one single support carrier 581, and one or more subpanel substrates 91A can be attached to the one or more elastic films 582. Subpanel substrate 91A can later be singulated into multiple unit substrates 11.

The present disclosure includes reference to certain examples. It will be understood, however, by those skilled in the art that various changes may be made, and equivalents may be substituted without departing from the scope of the disclosure. In addition, modifications may be made to the disclosed examples without departing from the scope of the present disclosure. Therefore, it is intended that the present disclosure is not limited to the examples disclosed, but that the disclosure will include examples falling within the scope of the appended claims.

The invention claimed is:

1. A method of manufacturing a semiconductor device, comprising:

receiving a panel comprising a panel base to which a plurality of subpanel substrates are coupled, the plurality of subpanel substrates comprising a first subpanel substrate, wherein the first subpanel substrate comprise a dielectric structure and a conductive structure;

cutting around a perimeter of the first subpanel substrate through a layer of a material over the panel base;

removing the first subpanel substrate from the panel;

providing a first electronic component and a second electronic component on the first subpanel substrate;

providing a first encapsulant on the first subpanel substrate, wherein the first encapsulant covers a lateral side of the first electronic component and a lateral side of the second electronic component;

singulating the first subpanel substrate into individual unit substrates, wherein cutting occurs prior to singulating, and wherein removing occurs after cutting and prior to providing the first electronic component, the second electronic component, and the first encapsulant.

2. The method of claim 1, comprising:

cutting around the first subpanel substrate through the layer of material by, at least in part, moving a first blade around at least a first partial perimeter of the first subpanel substrate.

3. The method of claim 1, wherein the layer of material comprises a subpanel body on an upper surface of the panel base and on an upper surface of the first subpanel substrate.

4. The method of claim 1, wherein the layer of material comprises an adhesive layer on an upper surface of the panel base and on a lower surface of the first subpanel substrate.

5. The method of claim 1, wherein:

the layer of material couples the first subpanel substrate to the panel base.

6. The method of claim 1, wherein, after cutting the layer of material, the layer of material is on an upper side of the panel base outside a footprint of the first subpanel substrate and on a lateral side of the first subpanel substrate.

7. The method of claim 1, wherein the panel is rectangular and the first subpanel substrate is circular.

8. The method of claim 1, wherein the plurality of subpanel substrates comprises a second subpanel substrate that is contiguous with the first subpanel substrate.

9. A method of manufacturing a semiconductor device, comprising:

receiving a panel to which a plurality of subpanels are coupled, the plurality of subpanels comprising a first subpanel;

cutting around a perimeter of the first subpanel through a layer of a material over the panel, wherein cutting includes cutting through the panel;

removing the first subpanel from the panel; and singulating the first subpanel into individual unit substates, wherein cutting occurs prior to singulating, and wherein removing occurs after cutting and prior to singulating.

10. The method of claim 9, wherein:

cutting around the perimeter of the first subpanel through the layer of material comprises, at least in part, moving a first blade around at least a first partial perimeter of the first subpanel.

11. The method of claim 9, comprising:

providing a first electronic component and a second electronic component on the first subpanel; and providing a first encapsulant on the first subpanel, wherein the first encapsulant covers a lateral side of the first electronic component and a lateral side of the second electronic component;

wherein removing occurs after cutting and prior to providing the first electronic component, the second electronic component, and the first encapsulant.

12. A method of manufacturing a semiconductor device, comprising:

receiving a panel to which a plurality of subpanels are coupled, the plurality of subpanels comprising a first subpanel;

cutting around a perimeter of the first subpanel through a layer of a material over the panel;

removing the first subpanel from the panel; and singulating the first subpanel into individual unit substates, wherein cutting occurs prior to singulating, and wherein removing occurs after cutting and prior to singulating, providing a first electronic component and a second electronic component on the first subpanel; and providing a first encapsulant on the first subpanel, wherein the first encapsulant covers a lateral side of the first electronic component and a lateral side of the second electronic component;

wherein removing occurs after cutting and prior to providing the first electronic component, the second electronic component, and the first encapsulant.

13. The method of claim 12, wherein:

cutting around the perimeter of the first subpanel through the layer of material comprises, at least in part, moving a first blade around at least a first partial perimeter of the first subpanel.

14. The method of claim 12, comprising:

providing a first electronic component and a second electronic component on the first subpanel; and providing a first encapsulant on the first subpanel, wherein the first encapsulant covers a lateral side of the first electronic component and a lateral side of the second electronic component;

wherein removing occurs after cutting and prior to providing the first electronic component, the second electronic component, and the first encapsulant.

15. The method of claim 12, wherein the panel is rectangular and the subpanels in the plurality of subpanels are circular.

16. The method of claim 12, wherein cutting includes cutting through the panel.

* * * * *